(12) United States Patent
Watanabe

(10) Patent No.: US 6,816,355 B2
(45) Date of Patent: Nov. 9, 2004

(54) CAPACITOR, SEMICONDUCTOR DEVICE, ELECTRO-OPTIC DEVICE, METHOD OF MANUFACTURING CAPACITOR, METHOD OF MANUFACTURING SEMICONDUCTOR DEVICE, AND ELECTRONIC APPARATUS

(75) Inventor: Yoshihiro Watanabe, Nagano-ken (JP)

(73) Assignee: Seiko Epson Corporation, Tokyo (JP)

( * ) Notice: Subject to any disclaimer, the term of this patent is extended or adjusted under 35 U.S.C. 154(b) by 137 days.

(21) Appl. No.: 10/237,043

(22) Filed: Sep. 9, 2002

(65) Prior Publication Data

US 2003/0063429 A1 Apr. 3, 2003

(30) Foreign Application Priority Data

| Sep. 13, 2001 | (JP) | 2001-278775 |
| Sep. 13, 2001 | (JP) | 2001-278776 |
| Jun. 27, 2002 | (JP) | 2002-188610 |
| Jun. 27, 2002 | (JP) | 2002-188611 |

(51) Int. Cl.[7] .............................................. H01G 4/228
(52) U.S. Cl. .................. 361/306.3; 361/311; 361/329.5
(58) Field of Search ...................... 361/311–313, 321.3, 361/306.3; 29/25.41, 25.42; 257/295, 763, 764, 308–310; 438/238, 240, 381

(56) References Cited

U.S. PATENT DOCUMENTS

| 5,444,006 A | * | 8/1995 | Han et al. ..................... 438/396 |
| 5,688,724 A | * | 11/1997 | Yoon et al. .................. 438/778 |
| 6,228,702 B1 | | 5/2001 | Hirota |
| 6,277,706 B1 | | 8/2001 | Ishikawa |
| 6,288,446 B2 | * | 9/2001 | Kwak et al. ................. 257/750 |
| 6,451,646 B1 | * | 9/2002 | Lu et al. ...................... 438/239 |
| 6,486,022 B2 | * | 11/2002 | Lee ............................. 438/240 |
| 6,608,357 B1 | * | 8/2003 | Yamazaki et al. .......... 257/412 |

FOREIGN PATENT DOCUMENTS

| JP | A 57-113264 | 7/1982 |
| JP | A 60-3126 | 1/1985 |
| JP | A 3-159247 | 7/1991 |
| JP | A 2000-305107 | 11/2000 |
| KR | 1999-006961 | 1/1999 |

OTHER PUBLICATIONS

Zhang Jin–yan, "Device for Manufacturing Semi–Conductor", *Applied Materials*, 1989 (w/English translation).

* cited by examiner

*Primary Examiner*—Anthony Dinkins
(74) *Attorney, Agent, or Firm*—Oliff & Berridge, plc

(57) ABSTRACT

A semiconductor device includes a TFT, a diode and a capacitor that each have an insulating layer which includes a tantalum oxide film formed by oxidizing a tantalum film at a temperature of 300° C. to 400° C. and under a pressure of 0.5 MPa to 2 MPa, and a silicon oxide film formed by a CVD method and the like. Therefore, the insulating layer includes the tantalum oxide film produced by high-pressure annealing and thus has high voltage resistance.

43 Claims, 33 Drawing Sheets

(A)

(B)

(A)

(B)

(A)

(B)

(C)

FORMATION REGION OF TFT 30    FORMATION REGION OF STORAGE CAPACITOR 70

(A)

(B)

(C)

(D)

FORMATION REGION OF TFT 30    FORMATION REGION OF STORAGE CAPACITOR 70

(A)

(B)

| FORMATION REGION OF TFT 30 | FORMATION REGION OF STORAGE CAPACITOR 70 |

(A)

(B)

CAPACITOR, SEMICONDUCTOR DEVICE, ELECTRO-OPTIC DEVICE, METHOD OF MANUFACTURING CAPACITOR, METHOD OF MANUFACTURING SEMICONDUCTOR DEVICE, AND ELECTRONIC APPARATUS

BACKGROUND OF THE INVENTION

1. Field of Invention

The present invention relates to a capacitor, a semiconductor device including a capacitor or a MIS (Metal-Insulator-Semiconductor)-type semiconductor device, an electro-optic device using the semiconductor device as an active matrix substrate, a method of manufacturing a capacitor, a method of manufacturing a semiconductor device, and an electronic apparatus. More specifically, the present invention relates to a technique for forming an insulating layer used for an electric element.

2. Description of Related Art

A technique for forming a capacitor on a substrate in any one of various semiconductor devices, generally includes laminating a lower electrode, an insulating layer as a dielectric layer, and an upper electrode in that order. In this case, a silicon oxide film or a tantalum oxide film is used as the insulating film. Of these oxide films, the silicon oxide film with high voltage resistance is formed in the related art by a method in which a silicon film is thermally oxidized at a temperature of about 1000° C. to 1300° C.

Of various semiconductor devices, each of a MIS diode and a thin film transistor (hereinafter "TFT") includes a MIS section, which includes a metal layer, an insulating layer and a semiconductor layer. As the insulating layer, a silicon oxide film obtained by thermally oxidizing a surface of a silicon film used as a semiconductor layer at a temperature of about 1000° C. to 1300° C. has high voltage resistance.

A tantalum oxide film has the advantage of a high dielectric constant, but formation of the tantalum oxide film by anodization requires feed wiring for anodization, thereby causing a problem of significantly decreasing the degree of design freedom of a semiconductor device including TFT, and the like formed on the same substrate. Also, the tantalum oxide film can be obtained by thermally oxidizing a tantalum film in the air at room temperature. However, such a tantalum oxide film has a problem of low voltage resistance.

The method of forming an insulating film at a high temperature of over 1000° C. has a problem in which an inexpensive substrate of glass or the like cannot be used as a substrate.

Furthermore, when aluminum wiring is formed on the substrate, treatment at a high temperature has the problem of failing to form the aluminum wiring because a treatment temperature of over 1000° C. exceeds the heat resistant temperature of the aluminum wiring.

SUMMARY OF THE INVENTION

The present invention provides a capacitor including an insulating layer having high voltage resistance even when it is formed at a relatively low temperature, a semiconductor device including the capacitor, an electro-optic device including the semiconductor device as an active matrix substrate, an electronic apparatus using the electro-optic device, a method of manufacturing a capacitor, and a method of manufacturing a semiconductor device.

The present invention provides a semiconductor device including a MIS section with high voltage resistance, which can be formed at a relatively low temperature, an electro-optic device including the semiconductor device as an active matrix substrate, an electronic apparatus using the electro-optic device, a method of manufacturing a capacitor, and a method of manufacturing a semiconductor device.

In order to address or achieve the above, a capacitor of the present invention includes a lower electrode, an insulating layer, and an upper electrode, which are laminated in that order. The insulating layer includes an oxide film formed by high-pressure annealing oxidation of an insulating layer-forming metal film under high pressure in an atmosphere containing water vapor.

In the present invention, the insulating layer may include only the oxide film or a multilayer structure including the oxide film and another insulating film.

In the present invention, a method of manufacturing a capacitor including a lower electrode, an insulating layer and an upper electrode includes forming a insulating layer-forming metal film, oxidizing the insulating layer-forming metal film by high-pressure annealing under high pressure in an atmosphere containing water vapor to form an oxide film which is used as the insulating layer or a part of the insulating layer.

In the present invention, high-pressure annealing is performed, for example, at a temperature of 600° C. or less. For example, high-pressure annealing is performed at a temperature of 300 to 400° C. under a pressure of 0.5 MPa to 2 MPa.

In the present invention, the insulating layer-forming metal film includes a tantalum (Ta) film or a tantalum alloy film.

In the present invention, the insulating layer of the capacitor contains the tantalum oxide film produced by high-pressure annealing, and thus has high voltage resistance. In the present invention, the tantalum oxide film is formed by high-pressure annealing, not by anodization, and thus feed wiring for anodization is not required. Therefore, a semiconductor device including TFT and the like formed on the same substrate has a high degree of design freedom. Furthermore, the tantalum oxide film having high uniformity can be obtained because of treatment under pressure. There is also the advantage that many substrates can be simultaneously treated. Furthermore, the temperature sufficient for high-pressure temperature is 600° C. or less, particularly 300° C. to 400° C., and thus no trouble occurs in use of a glass substrate as the substrate. Even if aluminum wiring is formed, high-pressure annealing under the temperature condition does not deteriorate the aluminum wiring unless the aluminum wiring is exposed from the surface of the substrate.

In the present invention, at least the insulating layer side of the lower electrode may include the same metal as, or a different material from, the insulating layer-forming metal film.

The capacitor having the above construction can be manufactured by a method in which only the surface of the insulating layer-forming metal film is oxidized by high-pressure annealing to form the oxide film used as the insulating layer or a part of the insulating layer, the remainder of the insulating layer-forming metal film being used as the lower electrode or a part of the lower electrode, or a method in which the lower electrode is formed below the insulating layer-forming metal film, and the insulating layer-forming metal film is entirely oxidized by high-pressure annealing to form the oxide film used as the insulating layer and a part of the insulating layer.

In the present invention, after high-pressure annealing, annealing is preferably performed under atmospheric pressure or low pressure. Such annealing can remove or substantially remove moisture contained in the tantalum oxide film to enhance crystallinity, thereby further enhancing voltage resistance.

The capacitor of the present invention is suitable to form a semiconductor device including other semiconductor elements formed on the same substrate. An example of such a semiconductor device is an active matrix substrate used for an electro-optic device, such as an active matrix liquid crystal device or the like. In the active matrix substrate, the capacitor of the present invention is used as, for example, a storage capacitor in each pixel.

In another aspect of the present invention, a semiconductor device includes a MIS semiconductor element formed on a substrate, and including a MIS section, which includes a metal layer, an insulating layer, and a semiconductor layer. The insulating layer includes an oxide film formed by high-pressure annealing oxidation of an insulating layer-forming metal film under high pressure in an atmosphere containing water vapor.

In the present invention, a method of manufacturing a semiconductor device including a MIS semiconductor element, which is formed on a substrate, and which includes a MIS section including a metal layer, an insulating layer, and a semiconductor layer, includes forming an insulating layer-forming metal film, and then oxidizing the insulating layer-forming metal film by high-pressure annealing under high pressure in an atmosphere containing water vapor to form an oxide film used as a part of the insulating layer.

In this method, high-pressure annealing is performed, for example, at a temperature of 300° C. to 400° C. under a pressure of 0.5 MPa to 2 MPa.

In the present invention, the insulating layer of the MIS section includes a tantalum oxide film formed by high-pressure annealing, and thus has high voltage resistance. Furthermore, the temperature sufficient to provide high-pressure annealing is 300° C. to 400° C., thereby causing no trouble in use of a glass substrate as the substrate. Even if aluminum wiring is formed, high-pressure annealing under the temperature condition does not deteriorate the aluminum wiring unless the aluminum wiring is exposed from the surface of the substrate.

In the present invention, after high-pressure annealing, annealing is preferably performed under atmospheric pressure or low pressure.

In this method, the insulating layer-forming metal film includes, for example, tantalum (Ta) or a tantalum alloy.

In the present invention, the insulating layer includes, for example, an oxide film formed on the metal layer side by using the insulating layer-forming metal film, and an insulating film formed on the semiconductor layer side by using a semiconductor material having the same composition as the semiconductor layer. Namely, with the semiconductor layer including silicon, the insulating layer includes a silicon oxide film or a silicon nitride film formed on the semiconductor layer side.

In the present invention, at least the insulating layer side of the metal layer may include the same metal material as the insulating layer-forming metal film or a different metal material from the insulating layer-forming metal film.

The semiconductor device having the above construction can be manufactured by a method in which only the surface of the insulating layer-forming metal film is oxidized by high-pressure annealing to form the oxide film used as a part of the insulating layer, the remainder of the insulating layer-forming metal film being used as the metal layer or a part of the metal layer, or a method in which the insulating layer-forming metal film is entirely oxidized by high-pressure annealing to form the oxide film used as a part of the insulating layer.

In the present invention, the metal layer, the insulating layer and the semiconductor layer may be laminated in that order from the lower layer side to the upper layer side, or the semiconductor layer, the insulating layer and the metal layer may be laminated in that order from the lower layer side to the upper layer side.

The semiconductor device having this construction can be manufactured, for example, by a method including forming the metal layer below the insulating layer-forming metal film, annealing the insulating layer-forming metal film under high pressure, and then forming in turn the insulating layer including the same semiconductor material as the semiconductor layer in that order on the oxide film of the insulating layer-forming metal film and the semiconductor layer. The semiconductor device of the present invention can also be manufactured by a method including forming the semiconductor layer and the insulating layer including the same semiconductor material as the semiconductor layer below the insulating layer-forming metal film, annealing the insulating layer-forming metal film under high pressure, and then forming the metal layer on an oxide film of the insulating layer-forming metal film.

In the present invention, the MIS-type semiconductor element is, for example, a thin film transistor.

By using a semiconductor substrate as the substrate, not only a thin film transistor but also a bulk-type MIS transistor can be formed as the MIS-type semiconductor element. Namely, an insulating film including the same semiconductor material as the semiconductor substrate used as the substrate is formed on the semiconductor substrate, the insulating layer-forming metal film is formed and annealed under high pressure, and then the metal layer is formed on an oxide film of the insulating layer-forming metal film.

In the present invention, a MIS diode can be formed as the MIS-type semiconductor element.

In the present invention, a capacitor may include at least an oxide film formed as a dielectric film by using the same layer as an oxide film of the insulating layer-forming metal film, and the metal layer used as one of electrodes.

This semiconductor device can be formed, for example, as an active matrix substrate used for an electro-optic device, such as an active matrix liquid crystal device or the like. In this case, the thin film transistor is used as a pixel switching nonlinear element on the substrate. In the present invention, preferably a storage capacitor includes at least an oxide film formed as a dielectric film by using the same layer as the oxide film of the insulating layer-forming metal film, and the metal layer used as one of electrodes.

An electro-optic device of the present invention can be used as a display section of an electronic apparatus such as a cellular phone, a mobile computer, or the like. An electro-optic device of the present invention can also be used as a light valve of a projection display device (electronic apparatus).

DETAILED DESCRIPTION OF PREFERRED EMBODIMENTS

Embodiments of the present invention are described below with reference to the drawings. A description is made of a semiconductor device including a capacitor to which the present invention is applied, and a method of manufacturing the semiconductor device according to each of first, second and third embodiments of the present invention. Also, a description is made of the configurations of TFT and MIS type diodes as a semiconductor device including a MIS semiconductor element to which the present invention is applied, and a method of manufacturing the semiconductor device according to each of fourth, fifth, sixth and seventh embodiments of the present invention. Furthermore, a description is made of an embodiment in which the present invention is applied to an active matrix substrate of a liquid crystal device.

[First Embodiment]

Figure 1:
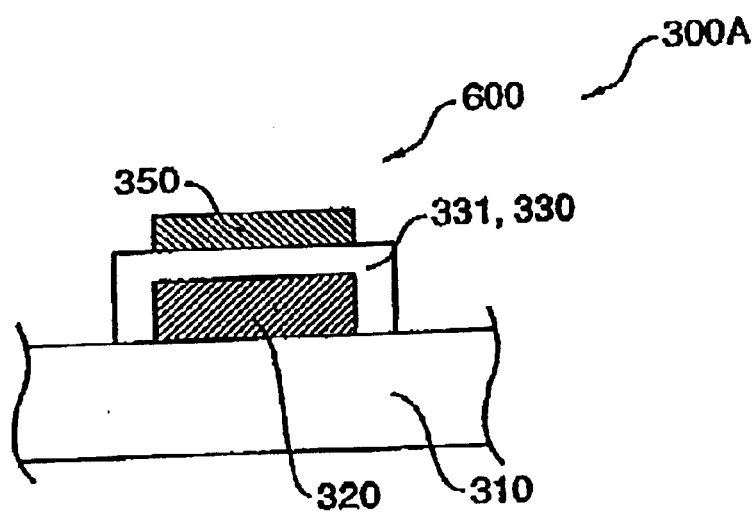
FIGS. 1(A) and 1(B) are sectional views schematically showing the constructions of semiconductor devices according to a first embodiment of the present invention and a modified embodiment thereof, respectively.
Figure 1:
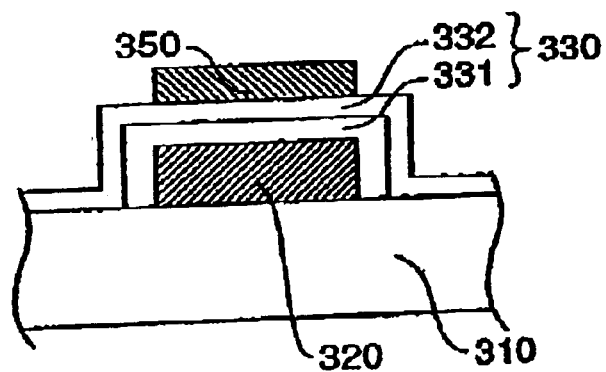

FIGS. 1(A) and 1(B) are sectional views schematically showing the constructions of semiconductor devices according to a first embodiment of the present invention and a modified embodiment thereof, respectively.

Referring to FIG. 1(A), in a semiconductor device 300A of this embodiment, a capacitor 600 and other semiconductor elements (not shown) are formed on a substrate 310. The capacitor 600 includes a lower electrode 320 including a tantalum film, an insulating layer 330 serving as a dielectric layer, and an upper electrode 350 including a silicon film doped with an impurity or a metal film.

The lower electrode 320 entirely includes a tantalum film, and the insulating layer 330 includes a tantalum oxide film 331 formed by oxidizing the surface of the tantalum film.

In this embodiment, in manufacturing the semiconductor device 300A having the above construction, the tantalum film (insulating layer-forming metal film) is formed on the substrate 310, and then the surface of the tantalum film is annealed under high pressure in an atmosphere containing water vapor. The conditions of high-pressure annealing include a temperature of 600° C. or less, for example, 300° C. to 400° C., and a pressure of 0.5 MPa to 2 MPa. As a result, only the surface of the tantalum film is oxidized to form the tantalum oxide film 331 so that the tantalum oxide film 331 is used as the insulating layer 330, and the remainder of the tantalum film is used as the lower electrode 320.

In the capacitor 600 of the semiconductor device 300A having the above construction, the insulating layer 330 includes the tantalum oxide film 331 formed by high-pressure annealing, and thus has high voltage resistance. Also, anodization is not performed to form the tantalum oxide film 331, and thus feed wiring for anodization is not required. Therefore, the semiconductor device 300A including TFTs and the like formed on the same substrate has a high degree of design freedom. There is also the advantage that many substrates 310 can be simultaneously processed. Furthermore, the sufficient temperature to provide high-pressure annealing is 600° C. or less, particularly 300° C. to 400° C., thereby causing no trouble in the use of a glass substrate as the substrate. Furthermore, even if aluminum wiring is formed, high-pressure annealing under the temperature condition does not deteriorate the aluminum wiring unless the aluminum wiring is exposed from the surface of the substrate.

Since the voltage resistance of the insulating layer 330 is enhanced as long as the insulating layer 330 contains the tantalum oxide film 331, for example, the insulating layer 330 may include the tantalum oxide film 331 formed on the lower side by high-pressure annealing the tantalum film, and a silicon oxide film 332 formed on the upper side by sputtering or the like, as shown in FIG. 1(B).

After high-pressure annealing, annealing is further performed under atmospheric pressure or low pressure at a temperature of 200° C. to 500° C. to remove moisture from the tantalum oxide film 331, thereby enhancing crystallinity and further enhancing the voltage resistance of the tantalum oxide film 331.

[Second Embodiment]

Figure 2:
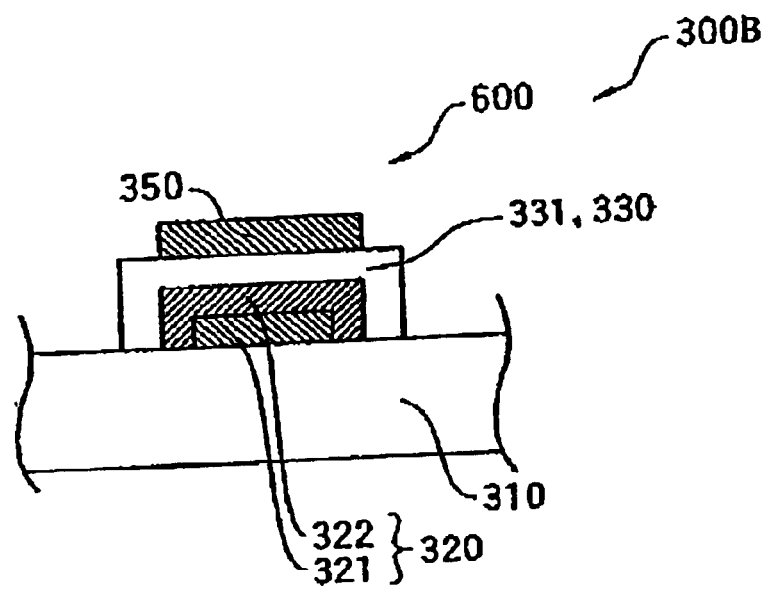
FIGS. 2(A) and 2(B) are sectional views schematically showing the construction of semiconductor devices according to a second embodiment of the present invention and a modified embodiment thereof, respectively.
Figure 2:
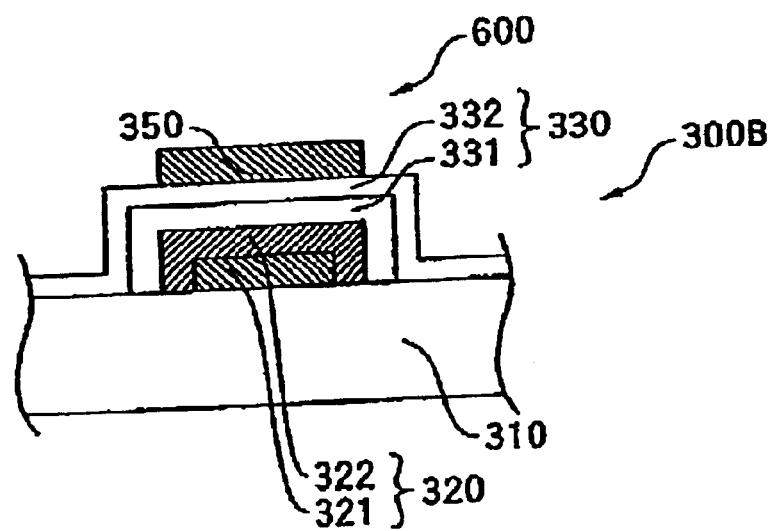

FIGS. 2(A) and 2(B) are sectional views schematically showing the constructions of semiconductor devices according to a second embodiment of the present invention and a modified embodiment thereof, respectively.

Referring to FIG. 2(A), in a semiconductor device 300B of this embodiment, a capacitor 600 and other semiconductor elements (not shown) are formed on a substrate 310. The capacitor 600 includes a lower electrode 320, an insulating layer 330 serving as a dielectric layer, and an upper electrode 350 including a silicon film doped with an impurity or a metal film.

The lower electrode 320 comprises a lower electrode layer 321 including a metal film, such as an aluminum film, a chromium film, or the like, or a silicon film doped with an impurity, and an upper electrode layer 322 including a tantalum film laminated on the lower electrode layer 321. The insulating layer 330 includes a tantalum oxide film 331 formed by oxidizing the surface of a tantalum film constituting the upper electrode layer 322.

In this embodiment, in manufacturing the semiconductor device 300B having the above construction, the lower electrode layer 321 is formed on the substrate 310, and then the tantalum film (insulating layer-forming metal film) is formed to cover the lower electrode layer 321. Then, the surface of the tantalum film is annealed under high pressure in an atmosphere containing water vapor. The conditions of high-pressure annealing include a temperature of 600° C. or less, for example, 300° C. to 400° C., and a pressure of 0.5 MPa to 2 MPa. As a result, only the surface of the tantalum film is oxidized to form the tantalum oxide film 331 so that the tantalum oxide film 331 is used as the insulating layer 330, and the remainder of the tantalum film is used as the upper electrode layer 322 of the lower electrode 320.

The capacitor 600 of the semiconductor device 300B having the above construction exhibits the same effect as the first embodiment in which the insulating layer 330 includes the tantalum oxide film 331 formed by high-pressure annealing, and thus has high voltage resistance. Also, in this embodiment, the lower electrode 320 has a two-layer structure comprising the lower electrode layer 321 and the upper electrode layer 322. Therefore, any desired conductive film can be used as the lower electrode layer 321 as long as the upper electrode layer 322 includes the tantalum film. Therefore, for example, by using an aluminum film with low electric resistance as the lower electrode layer 321, the electric resistance of the lower electrode 320 can be decreased.

In this embodiment, the voltage resistance of the insulating layer 330 is enhanced as long as the insulating layer 330 contains the tantalum oxide film 331, and thus, for example, the insulating layer 330 may include the tantalum oxide film 331 formed on the lower side by high-pressure annealing the tantalum film, and a silicon oxide film 332 formed on the upper side by sputtering or the like, as shown in FIG. 2(B).

After high-pressure annealing, annealing is further performed under atmospheric pressure or low pressure at a temperature of 200° C. to 500° C. to remove moisture from the tantalum oxide film 331, thereby enhancing crystallinity, and thus further enhancing the voltage resistance of the tantalum oxide film 331.

[Third Embodiment]

Figure 3:
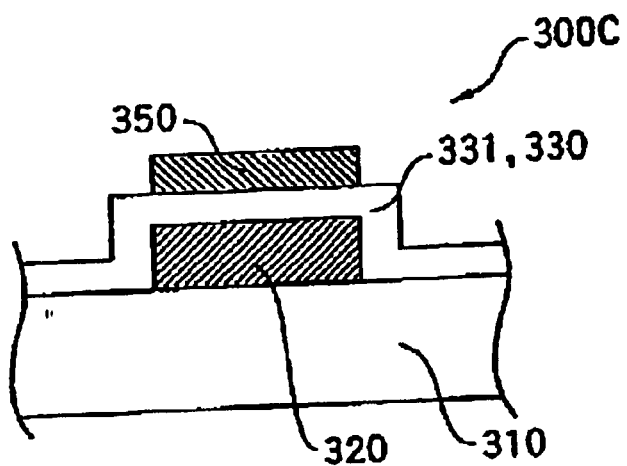
FIGS. 3(A) to 3(C) are sectional views schematically showing the constructions of semiconductor devices according to a third embodiment of the present invention and modified embodiments thereof, respectively.
Figure 3:
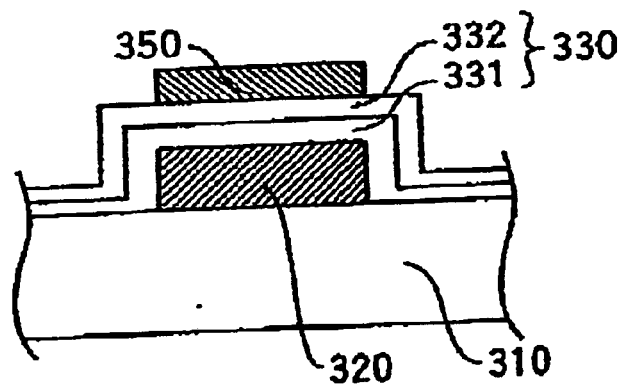
Figure 3:
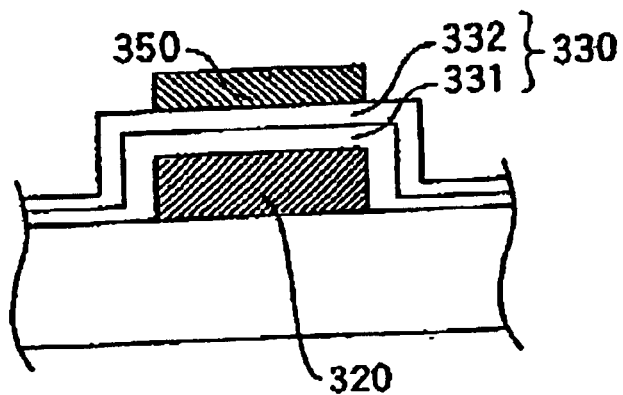

FIGS. 3(A) and 3(B) are sectional views schematically showing the constructions of semiconductor devices according to a third embodiment of the present invention and a modified embodiment thereof, respectively.

Referring to FIG. 3(A), in a semiconductor device 300C of this embodiment, a capacitor 600 and other semiconductor elements (not shown) are formed on a substrate 310. The capacitor 600 includes a lower electrode 320, an insulating layer 330 serving as a dielectric layer, and an upper electrode 350 including a silicon film doped with an impurity or a metal film.

The lower electrode 320 includes a silicon film doped with an impurity or a metal film, and the insulating layer 330 includes a tantalum oxide film 331 formed by oxidizing a tantalum film.

In this embodiment, in manufacturing the semiconductor device 300C having the above construction, the lower electrode 320 is formed on the substrate 310, and then the tantalum film (insulating layer-forming metal film) is formed to cover the lower electrode 320. Then, the tantalum film is entirely annealed under high pressure in an atmosphere containing water vapor. The conditions of high-pressure annealing include a temperature of 600° C. or less, for example, 300° C. to 400° C., and a pressure of 0.5 MPa to 2 MPa. As a result, the tantalum film is entirely oxidized to form the tantalum oxide film 331 so that the tantalum oxide film 331 is used as the insulating layer 330.

The capacitor 600 of the semiconductor device 300C having the above construction exhibits the same effect as the first embodiment in which the insulating layer 330 includes the tantalum oxide film 331 formed by high-pressure annealing, and thus has high voltage resistance. Also, in this embodiment, the tantalum film formed to cover the lower electrode 320 is entirely annealed under high pressure to form the tantalum oxide film 331. Therefore, the material of the lower electrode 320 is not limited. Therefore, by using an aluminum film with low electric resistance as the lower electrode 320, the electric resistance of the lower electrode 320 can be decreased.

In this embodiment, the voltage resistance of the insulating layer 330 is enhanced as long as the insulating layer 330 contains the tantalum oxide film 331. For example, therefore, the lower side of the insulating layer 330 may include the tantalum oxide film 331 formed by high-pressure annealing the tantalum film, and the upper side may include a silicon oxide film 332 formed by sputtering or the like, as shown in FIG. 3(B). Alternatively, the lower side of the insulating layer 330 may include the silicon oxide film 332 formed by sputtering or the like, and the upper side may include the tantalum oxide film 331 formed by high-pressure annealing the tantalum film, as shown in FIG. 3(C).

After high-pressure annealing, annealing is further performed under atmospheric pressure or low pressure at a temperature of 200° C. to 500° C. to remove moisture from the tantalum oxide film 331, thereby enhancing crystallinity and thus further improving the voltage resistance of the tantalum oxide film 331.

[Fourth Embodiment]

Figure 4:
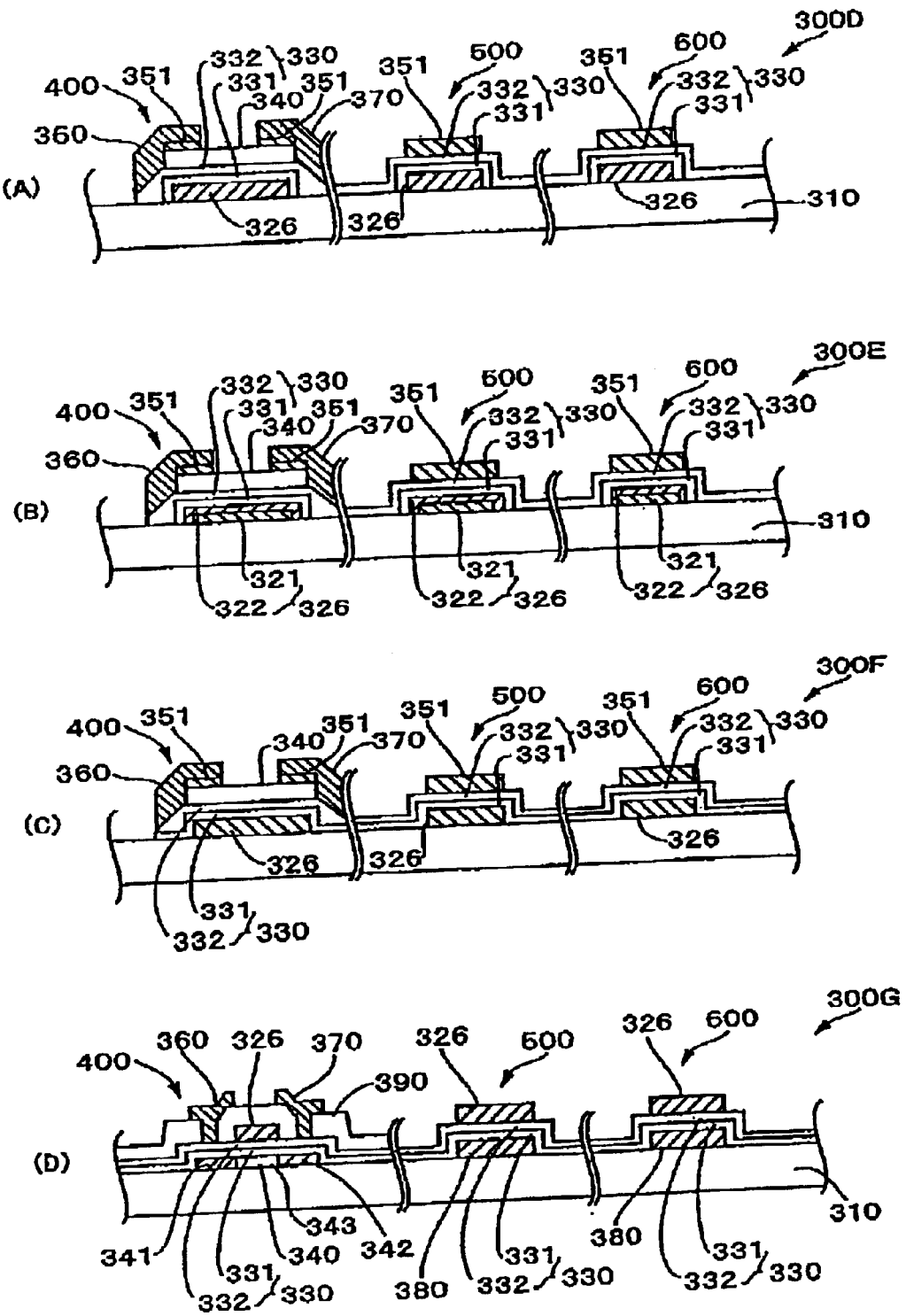
FIGS. 4(A) to 4(D) are sectional views schematically showing the constructions of semiconductor devices according to a fourth embodiment to a seventh embodiment of the present invention, respectively.

FIG. 4(A) is a sectional view schematically showing the construction of MIS semiconductor elements formed in a semiconductor device according to a fourth embodiment of the present invention.

Referring to FIG. 4(A), in a semiconductor device 300D according to the fourth embodiment, a TFT 400 including a MIS section in which a gate electrode including a metal layer 326, an insulating layer 330 serving as a gate insulating layer, and a semiconductor layer 340 including an intrinsic silicon film serving as an active layer are formed in that order, and a MIS diode 500 including a MIS section in which a metal layer 326, an insulating layer 330, and a semiconductor layer including a silicon film 351 doped with a N-type impurity are formed in that order are formed on a substrate 310. In the semiconductor device 300D of this embodiment, a capacitor 600 including a lower electrode including a metal layer 326, an insulating layer 330, and an upper electrode including a silicon film 351 doped with a N-type impurity, which are formed in that order, is also formed. on the substrate 310.

In this embodiment, all the metal layers 326 entirely include a tantalum film, and all the insulating layers 330 include a tantalum oxide film 331 formed by oxidizing the surface of the tantalum film, and a silicon oxide film 332 formed by a method such as CVD method or the like. Therefore, the metal layer 326 side of each of the insulating layers 330 includes the tantalum oxide film 331, and the silicon film 351 side includes the silicon oxide film 332.

In manufacturing the semiconductor device 300D having the above construction, in this embodiment, the tantalum film (insulating layer-forming metal film) is formed on the substrate 310, and then the surface of the tantalum film is annealed under high pressure in an atmosphere containing water vapor. The conditions of high-pressure annealing include a temperature, for example, of 300° C. to 400° C., and a pressure of 0.5 MPa to 2 MPa. As a result, only the surface of the tantalum film is oxidized to form the tantalum oxide film 331 so that the tantalum oxide film 331 is used as a part of each of the insulating layers 330, and the remainder of the tantalum film is used as each of the metal layers 326.

Next, the silicon oxide film 332 is formed on the surface of each of the tantalum oxide films 331 by CVD method or the like to form the insulating layers 330 each including the tantalum oxide film 331 and the silicon oxide film 332.

Next, in the TFT 400, an intrinsic silicon film 340 is formed on the insulating layer 330. In this case, the intrinsic silicon film is not formed on the MIS diode 500 and the capacitor 600.

Next, the silicon film 351 doped with a N-type impurity is formed on each of the TFT 400, the MIS diode 500 and the capacitor 600 to complete the MIS diode 500 and the capacitor 600.

In the MIS diode 500 and the capacitor 600, the silicon oxide film 332 may not be formed.

On the other hand, in the TFT 400, a source electrode 360 and a drain electrode 370 are formed to be connected to the silicon film 351 doped with a N-type impurity to complete the TFT 400.

In the semiconductor device 300D having the above construction, the insulating layer 330 includes the tantalum oxide film 331 formed by high-pressure annealing, and thus has high voltage resistance. Furthermore, the temperature of high-pressure annealing is 300° C. to 400° C., and thus causes no trouble, for example, in using a glass substrate as the substrate 310. Even if aluminum wiring is formed, high-pressure annealing under the above temperature condition does not deteriorate the aluminum wiring unless the aluminum wiring is exposed from the surface of the substrate.

After high-pressure annealing, annealing is further performed under atmospheric pressure or low pressure at a temperature of 200° C. to 500° C. to remove or substantially remove moisture from the tantalum oxide film 331, thereby further enhancing the voltage resistance of the tantalum oxide film 331.

[Fifth Embodiment]

FIG. 4(B) is a sectional view schematically showing the construction of MIS semiconductor elements formed in a semiconductor device according to a fifth embodiment of the present invention.

Referring to FIG. 4(B), like in the fourth embodiment, in a semiconductor device 300E according to the fifth embodiment, a TFT 400 including a MIS section in which a gate electrode including a metal layer 326, an insulating layer 330 serving as a gate insulating layer, and a semiconductor layer 340 including an intrinsic silicon film serving as an active layer are formed in this order, and a MIS diode 500 including a MIS section in which a metal layer 326, an insulating layer 330, and a semiconductor layer including a silicon film 351 doped with a N-type impurity are formed in that order are formed on a substrate 310. In the semiconductor device 300E of this embodiment, a capacitor 600 including a lower electrode including a metal layer 326, an insulating layer 330, and an upper electrode including a silicon film 351 doped with a N-type impurity, which are formed in that order, is also formed on the substrate 310.

In this embodiment, each of the metal layers 326 includes a lower metal film, for example, an aluminum film 321, other than a tantalum film, and a tantalum film 322 formed to cover the aluminum film 321.

All the insulating layers 330 include a tantalum oxide film 331 formed by oxidizing the surface of the tantalum film 322, and a silicon oxide film 332 formed by a method, such as CVD method or the like.

In manufacturing the semiconductor device 300E having the above construction, the aluminum film 321 and the tantalum film (insulating layer-forming metal film) are formed in that order on the substrate 310, and then the surface of the tantalum film is annealed under high pressure in an atmosphere containing water vapor. The conditions of high-pressure annealing include a temperature, for example, of 300° C. to 400° C., and a pressure of 0.5 MPa to 2 MPa. As a result, only the surface of the tantalum film is oxidized to form the tantalum oxide film 331 so that the tantalum oxide film 331 is used as a part of each of the insulating layers 330, and the remainder of the tantalum film 322 is used as upper layer of the metal layers 326.

The subsequent steps are the same as in the fourth embodiment, and a detailed description is thus omitted. Namely, the silicon oxide film 332 is formed on the surface of each of the tantalum oxide films 331 to form the insulating layers 330 each including the tantalum oxide film 331 and the silicon oxide film 332. Next, an intrinsic silicon film 340 is formed on the insulating layer 330 in the TFT 400, and then the silicon film 351 doped with, for example, a N-type impurity is formed in each of the TFT 400, the MIS diode 500 and the capacitor 600 to complete the MIS diode 500 and the capacitor 600. In the TFT 400, a source electrode 360 and a drain electrode 370 are formed to be connected to the silicon film 351 to complete the TFT 400.

The semiconductor device 300E having the above construction exhibits the same effect as the fourth embodiment in which the insulating layer 330 includes the tantalum oxide film 331 formed by high-pressure annealing, and thus has high voltage resistance. Furthermore, in this embodiment, each of the metal layers 326 has a two-layer structure including the aluminum film 321 with low electric resistance, and the tantalum film 322, and thus the metal layers 326 have low electric resistance. Furthermore, the temperature of high-pressure annealing to form the insulating layer 330 with high voltage resistance is 300° C. to 400° C., and thus causes no trouble, for example, in use of a glass substrate as the substrate 310. Even if the aluminum film 321 is formed, high-pressure annealing under the above temperature condition does not deteriorate the aluminum film 321 unless the aluminum film 321 is exposed from the surface of the substrate.

In this embodiment, after high-pressure annealing, annealing is further performed under atmospheric pressure or low pressure at a temperature of 200° C. to 500° C. to from the tantalum oxide film 331, thereby further enhancing the voltage resistance of the tantalum oxide film 331.

[Sixth Embodiment]

FIG. 4(C) is a sectional view schematically showing the construction of MIS semiconductor elements formed in a semiconductor device according to a sixth embodiment of the present invention.

Referring to FIG. 4(C), like in the fourth embodiment, in a semiconductor device 300F according to the sixth embodiment, a TFT 400 including a MIS section in which a gate electrode including a metal layer 326, an insulating layer 330 serving as a gate insulating layer, and a semiconductor layer 340 including an intrinsic silicon film serving as an active layer are formed in that order, and a MIS diode 500 including a MIS section in which a metal layer 326, an insulating layer 330, and a semiconductor layer including a silicon film 351 doped with a N-type impurity are formed in that order are formed on a substrate 310. In the semiconductor device 300F of this embodiment, a capacitor 600 including a lower electrode comprising a metal layer 326, an insulating layer 330, and an upper electrode comprising a silicon film 351 doped with a N-type impurity, which are formed in that order, is also formed on the substrate 310.

In this embodiment, all the insulating layers 330 include a tantalum oxide film 331 formed by oxidizing the surface of the tantalum film 332, and a silicon oxide film 332 formed by a method, such as CVD method or the like.

Unlike in the fourth embodiment, all the metal layers 326 include an aluminum film.

In manufacturing the semiconductor device 300F having the above construction, the metal layers 326 each including the aluminum film are formed on the substrate 310, and then a tantalum film (insulating layer-forming metal film) is formed.

Next, the tantalum film is entirely annealed under high pressure in an atmosphere containing water vapor. The conditions of high-pressure annealing include a temperature, for example, of 300° C. to 400° C., and a pressure of 0.5 MPa to 2 MPa. As a result, the tantalum film is entirety oxidized to form the tantalum oxide film 331 used as a part of each of the insulating layers 330.

The subsequent steps are the same as in the fourth embodiment, and a detail description is thus omitted. Namely, the silicon oxide film 332 is formed on the surface of each of the tantalum oxide films 331 to form the insulating layers 330 each including the tantalum oxide film 331 and the silicon oxide film 332. Next, an intrinsic silicon film 340 is formed on the insulating layer 330 in the TFT 400, and then the silicon film 351 doped with, for example, a N-type impurity is formed in each of the TFT 400, the MIS diode 500 and the capacitor 600 to complete the MIS diode 500 and the capacitor 600. In the TFT 400, a source electrode 360 and a drain electrode 370 are formed to be connected to the silicon film 351 to complete the TFT 400.

The semiconductor device 300F having the above construction exhibits the same effect as the fourth embodiment in which each of the insulating layers 330 includes the tantalum oxide film 331 formed by high-pressure annealing, and thus has high voltage resistance. Furthermore, in this embodiment, each of the metal layers 326 includes the aluminum film 321 with low electric resistance, and thus the metal layers 326 have low electric resistance. Furthermore, the temperature of high-pressure annealing to form the insulating layers 330 with high voltage resistance is 300° C. to 400° C., and thus causes no trouble, for example, in use of a glass substrate as the substrate 310. Even if the metal layers 326 each including the aluminum film are formed, high-pressure annealing under the above temperature condition does not deteriorate the metal layers 326 due to water vapor because the metal layers each including the aluminum film 321 are covered with the tantalum films without being exposed from the surface of the substrate.

In this embodiment, after high-pressure annealing, annealing is further performed under atmospheric pressure or low pressure at a temperature of 200° C. to 500° C. to remove or substantially remove moisture from the tantalum oxide films 331, thereby further enhancing the voltage resistance of the tantalum oxide films 331.

[Seventh Embodiment]

FIG. 4(D) is a sectional view schematically showing the construction of MIS semiconductor elements formed in a semiconductor device according to a seventh embodiment of the present invention.

Although, in the fourth, fifth, and sixth embodiments, TFT is an inverted-staggered type in which a gate electrode is positioned below an active layer, the present invention may be applied to a semiconductor device including a normally-staggered TFT in which a gate electrode is positioned above an active layer.

Referring to FIG. 4(D), in a semiconductor device 300G according to the seventh embodiment, a TFT 400 including a MIS section in which a semiconductor layer 340 including an intrinsic silicon film serving as an active layer, an insulating layer 330 serving as a gate insulating layer and a metal layer 326 serving as a gate electrode are formed in that order, and a MIS diode 500 including a MIS section in which a semiconductor layer 380 including a silicon film doped with a N-type impurity, an insulating layer 330 and a metal layer 326 are formed in that order are formed on a substrate 310. In the semiconductor device 300G of this embodiment, a capacitor 600 including a lower electrode (a semiconductor layer 380) including a silicon film doped with a N-type impurity, an insulating layer 330 and upper electrode including a metal layer 326, which are formed in that order, is also formed on the substrate 310.

In this embodiment, all the metal layers 326 entirely include any of various metal films, such as a tantalum film, a chromium film, an aluminum film, and the like, and all the insulating layers 330 include a tantalum oxide film 331 formed by oxidizing the tantalum film, and silicon oxide film 332 formed by a method, such as CVD method or the like.

In the semiconductor device 300G of this embodiment, the semiconductor layer 340 includes a channel formation region 343, which comprises an intrinsic silicon film and which is opposed to the metal layer 326 serving as the gate electrode through the insulating layer 330, and a source region 341 and a drain region 342, which are positioned on both sides of the channel-forming region 343 and which are doped with a N-type impurity in self alignment with the metal layer 326 (gate electrode). Also, a source electrode 360 and a drain electrode 370 are electrically connected to the source region 341 and the drain region 342 respectively, through contact holes formed in an interlayer insulating film 390.

In manufacturing the semiconductor device 300G having the above construction, the semiconductor layer 340 and the silicon film 380 each including an intrinsic silicon film are formed in islands on the substrate 310, and then a tantalum film (insulating layer-forming metal film) is formed on the surface side.

Next, the tantalum film is entirely annealed under high pressure in an atmosphere containing water vapor. The conditions of high-pressure annealing include a temperature, for example, of 300° C. to 400° C., and a pressure of 0.5 MPa to 2 MPa. As a result, the tantalum film is entirely oxidized to form the tantalum oxide film 331. Then, the silicon oxide film 332 is formed on the surface of the tantalum oxide film 331 by CVD method or the like to form the insulating layer 330 including the tantalum oxide film 331 and the silicon oxide film 332.

Next, the silicon films 380 are doped with a N-type impurity through the insulating layer 330. However, an impurity is not introduced into the semiconductor layer 340 of the TFT 400.

Next, the metal layers 326 are formed on the surface of the insulating layer 330 to complete the MIS diode 500 and the capacitor 600.

On the other hand, in the TFT 400, the semiconductor layer 340 is doped with a N-type purity using, as a mask, the metal layer 326 as the gate electrode. As a result, the regions into which the impurity is introduced are the source region 341 and the drain region 342, and the region into which the impurity is not introduced is the channel-forming region 343.

Next, the interlayer insulating film 390 comprising a silicon oxide film is formed on the gate electrode (the metal layer 326), and then contact holes are formed in the interlayer insulating film 390. Then, the source electrode 360 and the drain electrode 370 are formed to complete the TFT 400.

In the semiconductor device 300G having the above construction, the insulating layer 330 includes the tantalum oxide film 331 formed by high-pressure annealing, and thus has high voltage resistance. Furthermore, the temperature of high-pressure annealing is 300° C. to 400° C., and thus causes no trouble, for example, in use of a glass substrate as the substrate 310. Even if aluminum wiring is formed, high-pressure annealing under the above temperature condition does not deteriorate the aluminum wiring unless aluminum wiring is exposed from the surface of the substrate.

After high-pressure annealing, annealing is further performed under atmospheric pressure or low pressure at a temperature of 200° C. to 500° C. to remove or substantially remove moisture from the tantalum oxide films 331, thereby further enhancing the voltage resistance of the tantalum oxide films 331.

[Eighth Embodiment]

A description will now be made of an embodiment in which the present invention is applied to an active matrix substrate used in an active matrix liquid crystal device as an example of a semiconductor device and an electro-optic device.

(Entire Construction of Liquid Crystal Device)

Figure 5:
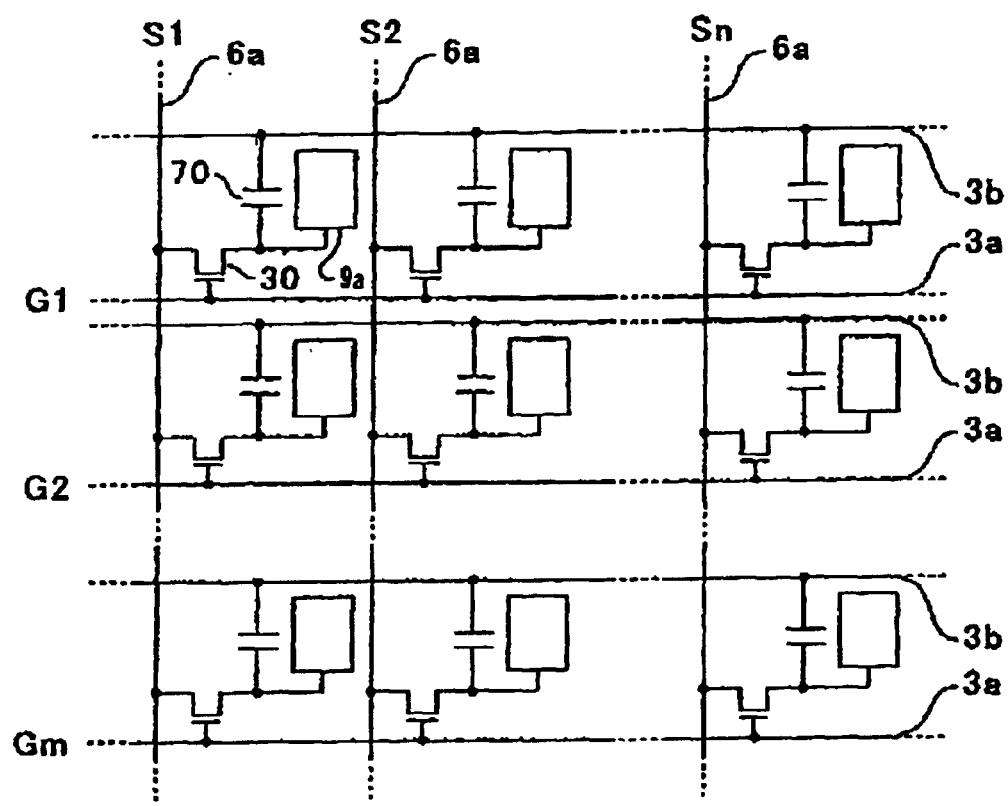
FIG. 5 is an equivalent circuit diagram showing various elements and wiring formed in plurality of pixels which are arranged in a matrix in an image display area of a liquid crystal device to which the present invention is applied.
Figure 6:
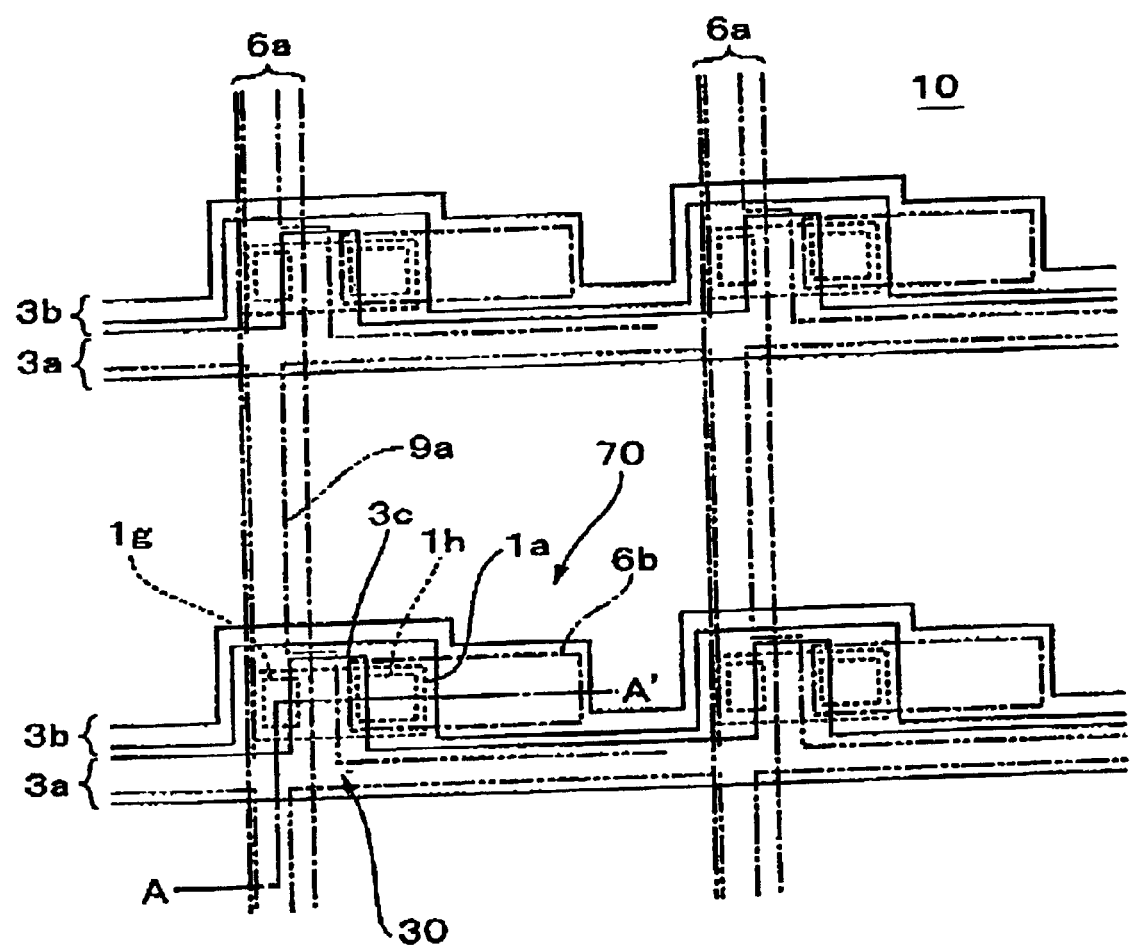
FIG. 6 is a plan view showing a configuration of pixels formed on an active matrix substrate in the liquid crystal device shown in FIG. 5 according to an eighth embodiment of the present invention.
Figure 7:
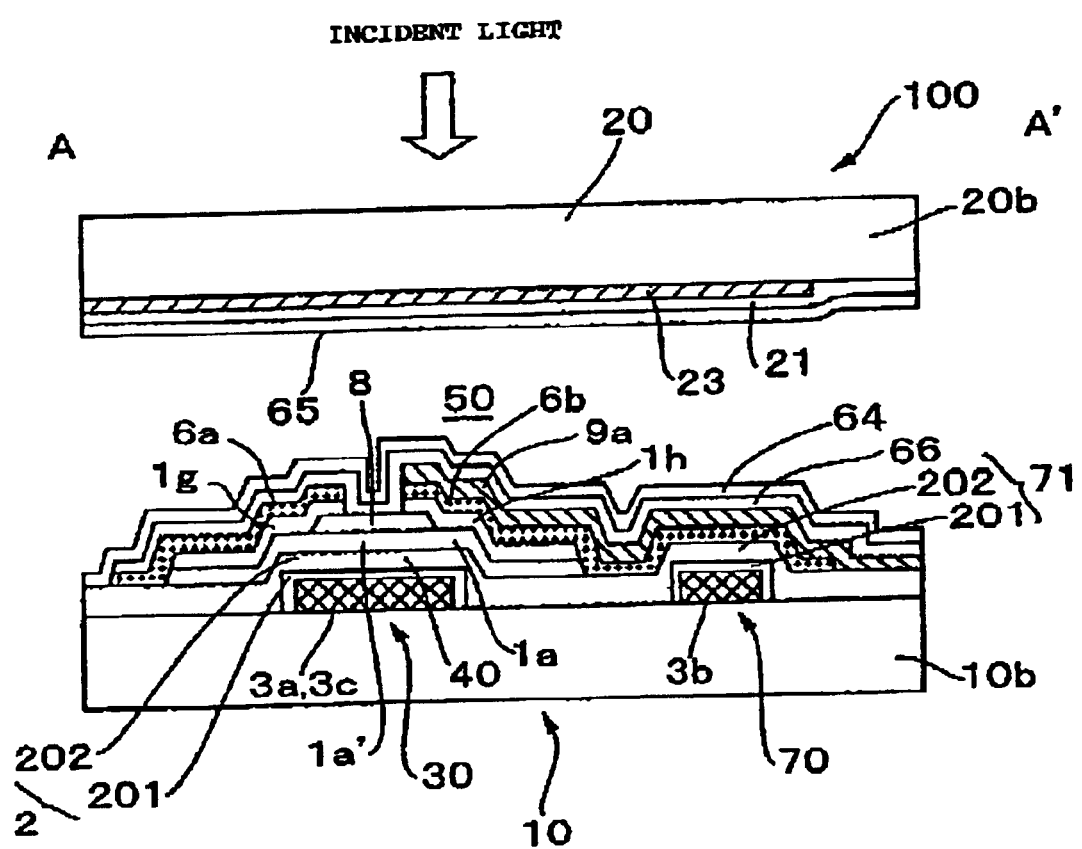
FIG. 7 is a sectional view of the liquid crystal device shown in FIG. 6 taken along plane A–A' in FIG. 6.
Figure 8:
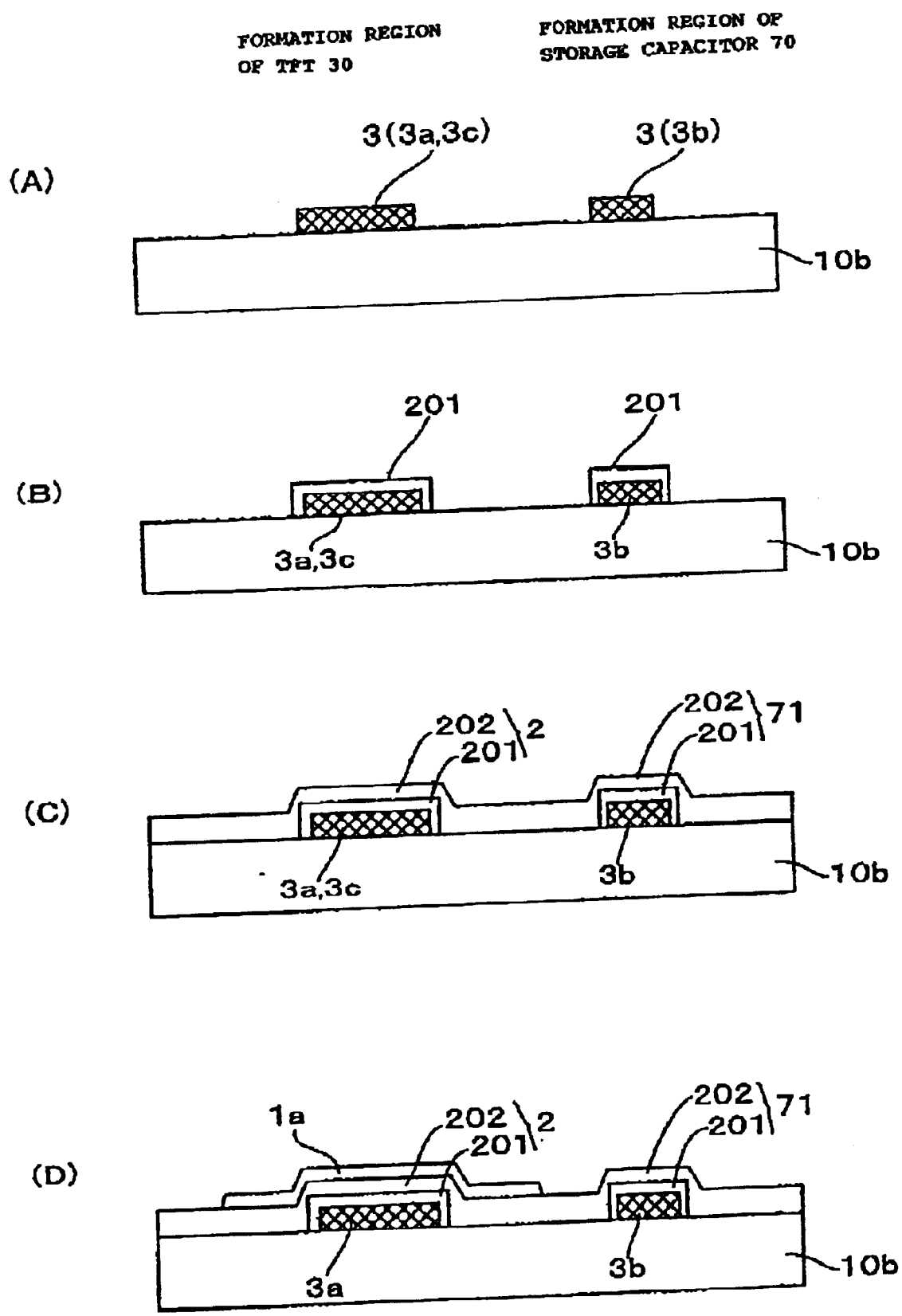
FIGS. 8(A) to 8(D) are sectional views respectively showing the steps of a method manufacturing the active matrix substrate shown in FIGS. 6 and 7.
Figure 9:
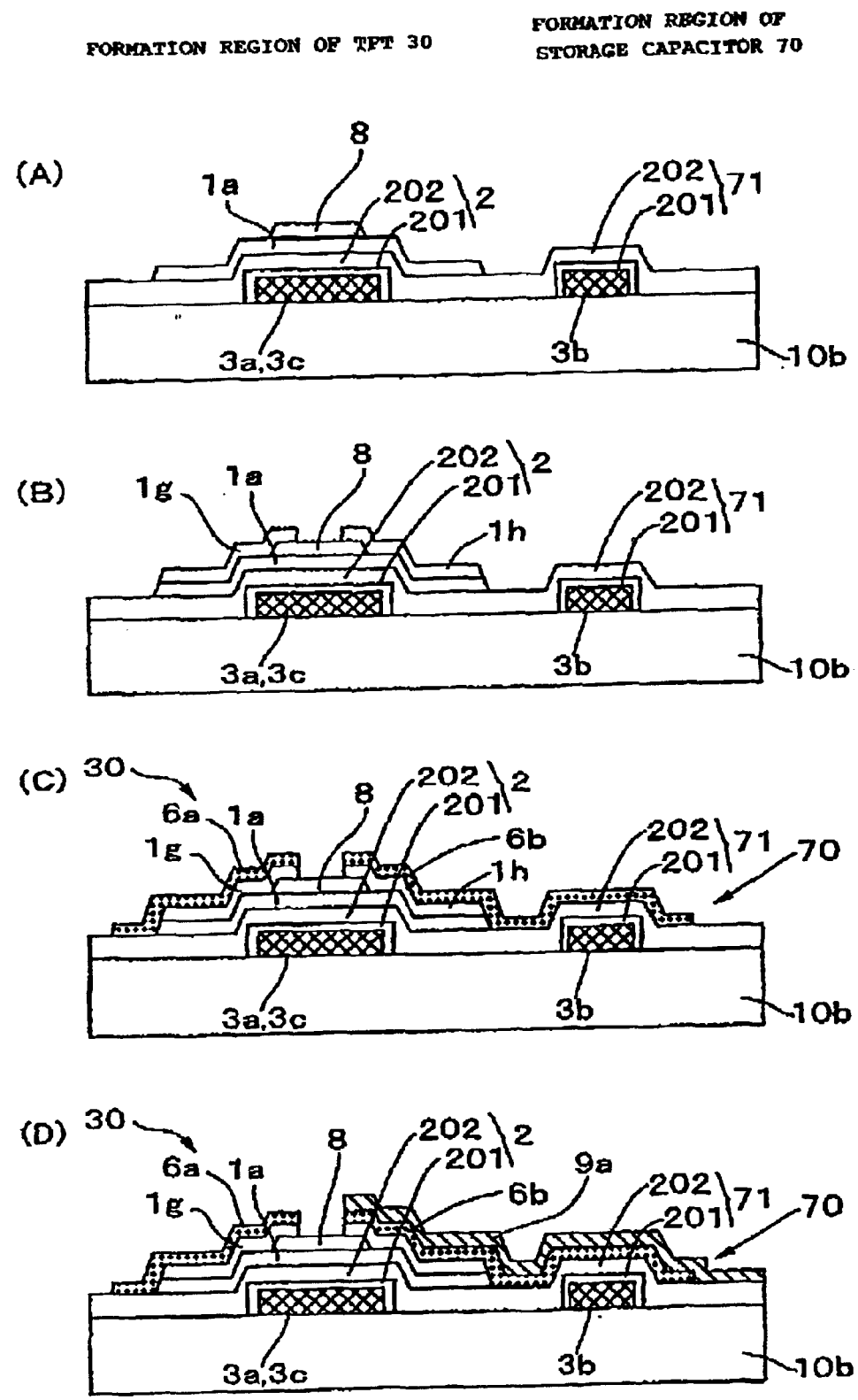
FIGS. 9(A) to 9(D) are sectional views respectively showing the steps after the steps shown in FIGS. 8(A)–8(B) in the method of manufacturing the active matrix substrate shown in FIGS 6 and 7.

The construction and operation of an active matrix liquid crystal device (electro-optic device) are described with reference to FIGS. 5, 6 and 7. FIG. 5 is an equivalent circuit diagram showing various elements, wiring, etc. of a plurality of pixels which are formed in a matrix to form an image display area of a liquid crystal device. FIG. 6 is a plan view of the adjacent pixels on the active matrix substrate on which data lines, scanning lines, pixel electrodes, etc. are formed. FIG. 7 is a sectional view taken along plane A–A' in FIG. 6, illustrating a state in which a liquid crystal as an electro-optic material is sealed between the active matrix substrate and a counter substrate. In these figures, in order to make the size of each of layers and members recognizable, the layers and members are shown on different contraction scales.

In FIG. 5, a pixel electrode 9a and a pixel switching TFT 30 to control the pixel electrode 9a are formed in each of a plurality of pixels, which are formed in a matrix in the image display area of the liquid crystal device, and data lines 6a to supply pixel signals are electrically connected to the sources of the TFTs 30. Pixel signals S1, S2 . . . Sn written on the data lines 6a are line-sequentially supplied in that order. Also, scanning lines 3a are electrically connected to the gates of the TFTs 30 so that pulsed scanning signals G1, G2 . . . Gm are line-sequentially supplied in that order to the scanning lines with predetermined timing. The pixel electrodes 9a are electrically connected to the drains of the TFTs 30 so that the TFTs 30 serving as switching elements are turned on for a predetermined period to write the pixel signals S1, S2 . . . Sn supplied from the data lines 6a in the pixels with predetermined timing. In this way, the pixel signals S1, S2 . . . Sn at a predetermined level written on the liquid crystal through the pixel electrodes 9a are maintained, for a predetermined period, between the pixel electrodes 9a and a counter electrode formed on a counter substrate described below.

In order to prevent or substantially prevent a leakage of the maintained pixel signals, a hold capacitor 70 (capacitor) is added in parallel with a liquid crystal capacitor formed between each of the pixel electrodes 9a and the counter electrode. By providing the hold capacitor 70, the voltage of each of the pixel electrodes 9a is maintained for a time of thousand times as long as the application time of a source voltage. This can enhance a charge-holding property to realize a liquid crystal device capable of display with a high contrast ratio. As a method of forming the hold capacitors 70, the hold capacitors 70 may be formed between capacity lines 3b as wiring to form capacity, and the pixel electrodes 9a, or between the scanning lines 3a and the pixel electrodes 9a.

In FIG. 6, a plurality of the transparent pixel electrodes 9a (regions surrounded by two-dot chain lines) are formed for each pixel in a matrix on the active matrix substrate 10 of the liquid crystal device, and the data lines 6a (shown by one-dot chain lines), the scanning lines 3a (shown by solid lines) and the capacity lines 3b (shown by solid lines) are formed along the longitudinal and lateral boundary regions of the pixel electrodes 9a. In this embodiment, in each of the semiconductor layers 1a, the gate electrode 3c is projected from the corresponding scanning line 3a to face the channel-forming region.

As shown in FIG. 7, a liquid crystal device 100 includes the active matrix substrate 10 and a counter substrate 20 disposed opposite to the substrate 10. The active matrix substrate 10 includes a transparent base plate 10b such as a quartz plate or a heat-resistance glass plate, and the counter substrate 20 also includes a transparent base plate 20b such as a quartz plate or a heat-resistance glass plate. The pixel electrodes 9a are formed on the active matrix substrate 10, and an alignment film 64 subjected to predetermined rubbing is formed on the pixel electrodes 9a. Each of the pixel electrodes 9a includes a transparent conductive thin film, for example, an ITO (Indium Tin Oxide) film, or the like. The alignment film 64 includes an organic thin film, for example, a polyimide thin film, or the like.

In the active matrix substrate 10, the pixel switching TFT 30 (MIS-type semiconductor element) is formed adjacent to each of the pixel electrodes 9a, to control switching of the pixel electrode 9a. Each of the TFTs 30 is an inverted-staggered type including a MIS section in which a gate electrode 3c (metal layer), a gate insulating layer 2 (insulating layer), an intrinsic silicon film 1a (semiconductor layer) are formed in that order from the lower side to the upper side. Also, a channel stopper 8 comprising a silicon oxide film is formed on the silicon film 1a, and a source region 1g and a drain region 1h each comprising a silicon film doped with a N-type impurity are formed on the channel stopper 8 so that the ends thereof overlap with the channel stopper 8. Furthermore, the data line 6a is formed on the source region 1g, and the pixel electrode 9a is formed on the drain region 1h. Furthermore, a protective film 66 and an alignment film 64 are formed in that order on the pixel electrodes 9a.

In this embodiment, the storage capacitor 70 (capacitor) is formed by using, as a dielectric layer, an insulating layer 71 formed by using the same layer as the gate insulating layer 2 of each of the TFTs 30. In the storage capacitor 70, a capacity line 3b (lower electrode), the insulating layer 71, and a drain electrode 6b (upper electrode) are formed in that order from the lower side to the upper side.

On the other hand, in the counter substrate 20, a counter electrode 21 is formed over the entire surface, and an alignment film 65 subjected to orientation treatment, such as rubbing or the like, is formed on the surface of the counter electrode 21. The counter electrode 21 also includes a transparent conductive thin film, for example, an ITO film or the like. The alignment film 65 of the counter substrate 20 also includes an organic thin film, such as a polyimide thin film or the like. Also, a counter substrate-side light shielding film 23 is formed in a matrix shape on the counter substrate 20, except an aperture region of each of the pixels. Therefore, light incident on the counter substrate 20 does not reach the channel-forming regions 1a' of the semiconductor layers 1a of the TFTs 30. Furthermore, the light shielding film 23 formed on the counter substrate 20 has the function to enhance contrast.

The active matrix substrate 10 and the counter substrate 20 each having the above construction are disposed so that the pixel electrodes 9a and the counter substrate 21 oppose each other, and a liquid crystal 50 serving as an electro-optic material is held between both substrates and sealed in the space surrounded by a sealing material described below. The liquid crystal 50 is put into a predetermined orientation state by the alignment films with no electric field applied from the pixel electrodes 9a. The liquid crystal 50 includes, for example, a nematic liquid crystal or a mixture of several nematic liquid crystals. The sealing material serves as an adhesive and comprises a photo-curing resin or thermosetting resin to bond together the peripheries of the active matrix substrate 10 and the counter substrate 20, and a gap material, such as glass fibers, glass beads, or the like is mixed with the adhesive, to maintain the predetermined distance between both substrates.

(Constructions of the gate insulating layer 2 and the insulating layer 71)

In the liquid crystal device 100 having the above construction, the MIS sections of the TFTs 30 and the storage capacitors 7 on the active matrix substrate 10 are formed as described below.

In this embodiment, each of the scanning lines 3a and the gate electrodes 3c includes a tantalum film, and the tantalum oxide film 201 formed by oxidizing the surface of the tantalum film is used as a part of each of the gate insulating films 2. Namely, each of the gate insulating films 2 includes the tantalum oxide film 201 formed by oxidizing the surface of the tantalum film used for the scanning lines 3a and the gate electrodes 3c, and the silicon oxide film 202 formed on the surface of the tantalum oxide film 201 by CVD method or the like.

In this embodiment, the capacity line 3b constituting each of the storage capacitors 70 also includes a tantalum film, and the tantalum oxide film 201 formed by oxidizing the surface of the tantalum film constitutes a part of the insulating layer 71. Namely, like the gate insulating films 2 constituting each of the storage capacitors 70, each of the insulating layers 71 includes the tantalum oxide film 201 formed by oxidizing the surface of the tantalum film used for the capacity lines 3b, and the silicon oxide film 202 formed on the surface of the tantalum oxide film 201 by CVD method or the like.

In forming the tantalum oxide film 201 by oxidizing the tantalum film, as described below, the tantalum film is formed as an insulating layer-forming metal film, and then the surface of the tantalum film is annealed under high pressure in an atmosphere. containing water vapor. The conditions of high-pressure annealing include a temperature of 600° C. or less, for example, a temperature of 300° C. to 400° C., and a pressure of 0.5 MPa to 2 MPa. As a result, only the surface of the tantalum film is oxidized to form the tantalum oxide film 201, and the tantalum oxide film 201 is used as a part of each of the gate insulating layers 2 and the insulating layers 71, the remainder of the tantalum films being used as the scanning lines 3a, the gate electrodes 3c and the capacity lines 3b.

In this way, in the active matrix substrate 10 of this embodiment, the gate insulating layer 2 constituting each of the TFTs 30 contains the tantalum oxide film 201. formed by high-pressure annealing, and thus has high voltage resistance. Also, the insulating layer 71 constituting each of the storage capacitors 70 contains the tantalum oxide film 201 formed by high-pressure annealing, and thus has high voltage resistance. Furthermore, anodization is not performed to form the tantalum oxide films 201, and thus feed wiring is not required for anodization. Therefore, the layout of the active matrix substrate 10 on which the TFTs 30,. etc., are formed need not be significantly changed from a related art substrate. Also, high-pressure annealing has the advantage that many active matrix substrates 10 can be simultaneously processed. Since the sufficient temperature for high-pressure annealing is 600° C. or less, particularly 300° C. to 400° C., there is no trouble in using a glass substrate as the substrate. Also, high-pressure annealing is performed under pressure, and thus the tantalum oxide films 201 can be uniformly formed. Even if aluminum wiring is formed, high-pressure annealing under the temperature condition does not deteriorate the aluminum wiring unless the aluminum wiring is exposed from the surface of the substrate.

As shown in FIG. 4(B), another electrode layer, such as an aluminum electrode, may be present below the tantalum film in each of the gate electrode 3c.

(Method of manufacturing the active matrix substrate 10)

The method of manufacturing the active matrix substrate 10 for the liquid crystal display having the above construction will be described below with reference to FIGS. 8(A)–9(D).

FIGS. 8(A)–9(D) are sectional views of the active matrix substrate 10 respectively showing the steps of the method of manufacturing the active matrix substrate 10 of this embodiment, taken along plane A–A' in FIG. 6.

As shown in FIG. 8(A), the transparent substrate 10b is first prepared as a base material of the active matrix substrate 10, and then a tantalum film 3 (insulating layer-forming metal film) is formed over the entire surface of the transparent substrate 10b by sputtering or the like. Then, the tantalum film 3 is patterned along the formation patterns of the scanning lines 3a, the gate electrodes 3c and the capacity lines 3b by a photolithography technique.

Next, the surface of the tantalum film 3 is annealed under high pressure in an atmosphere containing water vapor. The conditions of high-pressure annealing include a temperature of 600° C. or less, for example, 300° C. to 400° C., and a pressure of 0.5 MPa to 2 MPa. As a result, as shown in FIG. 8(B), only the surface of the tantalum film 3 is oxidized to form the tantalum oxide film 201, and thus the tantalum oxide film 201 is used as a part of each of the gate insulating layers 2 and the insulating layers 71, the remainder of the tantalum film being used as each of the scanning lines 3a, the gate electrodes 3c and the capacity lines 3b.

After high-pressure annealing, annealing is further performed at a temperature of 200° C. to 500° C. under atmospheric pressure or low pressure to remove moisture from the tantalum oxide film 201, thereby enhancing crystallinity and thus enhancing the quality of the tantalum oxide film 201.

Next, as shown in FIG. 8(C), the silicon oxide film 202 is formed over the entire surface of the transparent substrate 10b by atmospheric-pressure or low-pressure CVD method using a TEOS (tetraethyl orthosilicate) gas, TEB (tetraethyl borate) gas, TMOP (tetramethyl oxyphosphate) gas, and the like. Consequently, the gate insulating layers 2 and the insulating layers 71 each including the tantalum oxide film 201 and the silicon oxide film 202 are formed.

Next, an amorphous silicon film is formed over the entire surface of the transparent substrate 10b by a low-pressure CVD method using a monosilane gas, a disilane gas, or the like at a flow rate of about 400 cc/min to 600 cc/min in a relative-low-temperature environment of about 450° C. to 550° C., preferably about 500° C., and then patterned by the photolithography technique to form island-like silicon films 1a on the gate insulating layers 2, as shown in FIG. 8(D). In this step, the amorphous silicon film 1 may be annealed at about 600° C. for about 1 hour to 10 hours in a nitrogen atmosphere to forming polysilicon films by solid-phase growth.

Next, a silicon oxide film is formed over the entire surface of the transparent substrate 10b to cover the silicon film 1, and then patterned by the photolithography technique to form etching stoppers 8 on the semiconductor films 1a, as shown in FIG. 9(A).

Next, a silicon film doped with a N-type impurity is formed over the entire surface of the transparent substrate 10b by the CVD method or the like, and then patterned by the photolithography technique to form the source regions 1g and the drain regions 1h so that the ends of both regions overlap with each of the channel stoppers 8, as shown in FIG. 9(B).

Next, a conductive film such as an aluminum film is formed over the entire surface of the transparent substrate 1b by a sputtering method or the like to cover the source regions 1g and the drain regions 1h, and then patterned by the photolithography technique to form the data lines 6a and the drain electrodes 6b which overlap with the source regions 1g and the drain regions 1h, respectively, as shown in FIG. 9(C). In this step, the drain electrodes 6b are formed as upper electrodes to partially overlap with the capacity lines 3b (lower electrodes). As a result, the TFTs 30 and the storage capacitors 70 are formed.

Next, an ITO film is formed over the entire surface of the transparent substrate 10b by the sputtering method or the like, and then patterned by the photolithography technique to form the pixel electrodes 9a, as shown in FIG. 9(D).

Then, as shown in FIG. 7, the protective film 66 and the alignment film 64 are formed on the pixel electrodes 9a to complete the active matrix substrate 10.

As shown in FIG. 4(B), another electrode layer such as an aluminum electrode may be present below the tantalum film of each of the gate electrode 3c.

[Ninth Embodiment]

A description will now be made of an active matrix substrate for a liquid crystal device as a semiconductor device according to a ninth embodiment of the present invention with reference to FIGS. 10–12(D). The basic constructions of an active matrix substrate and a liquid crystal device using the active matrix substrate according to each of this embodiment, and the tenth, eleventh, twelfth and thirteenth embodiments below are same as the eighth embodiment, and thus portions having the same functions as the eighth embodiment are denoted by the same reference numerals, and a detailed description of these portions is omitted.

Figure 10:
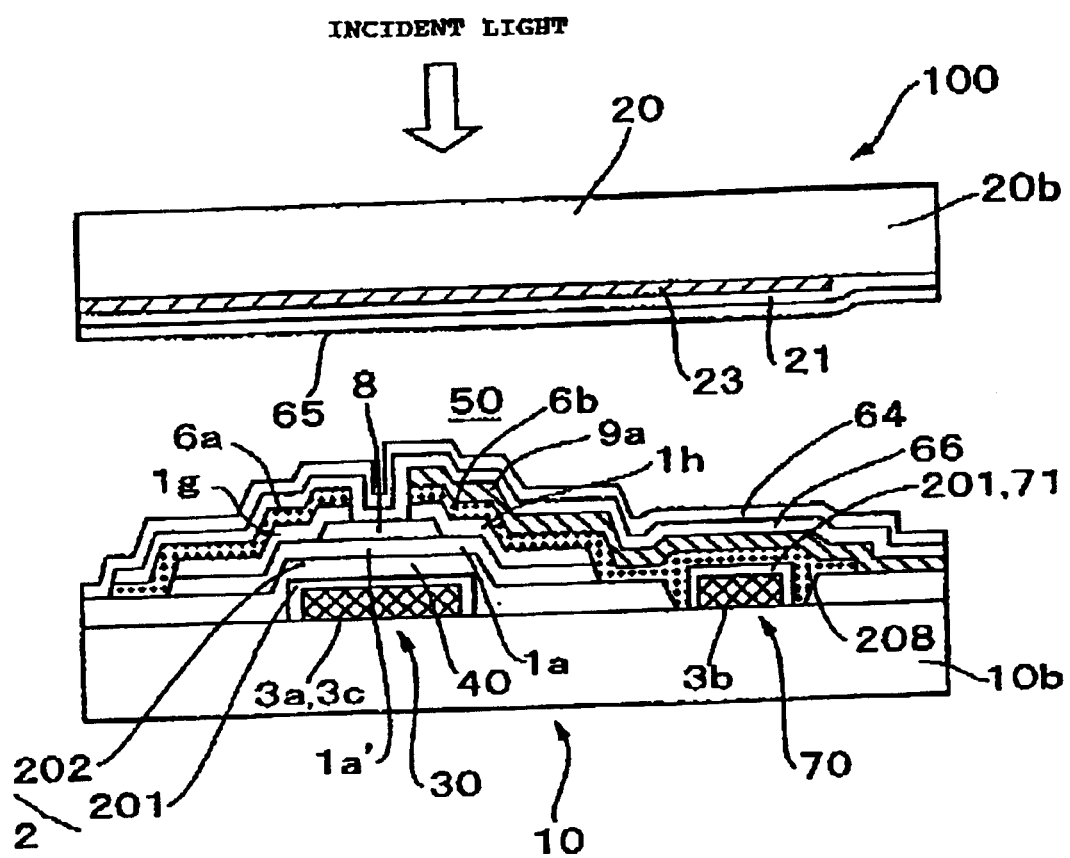
FIG. 10 is a sectional view of a liquid crystal device according to a ninth embodiment of the present invention taken along a plane corresponding to plane A–A' in FIGS. 11(A) to 11(E) are sectional views respectively showing the steps of a method of manufacturing the active matrix substrate shown in FIG. 10.
Figure 11:
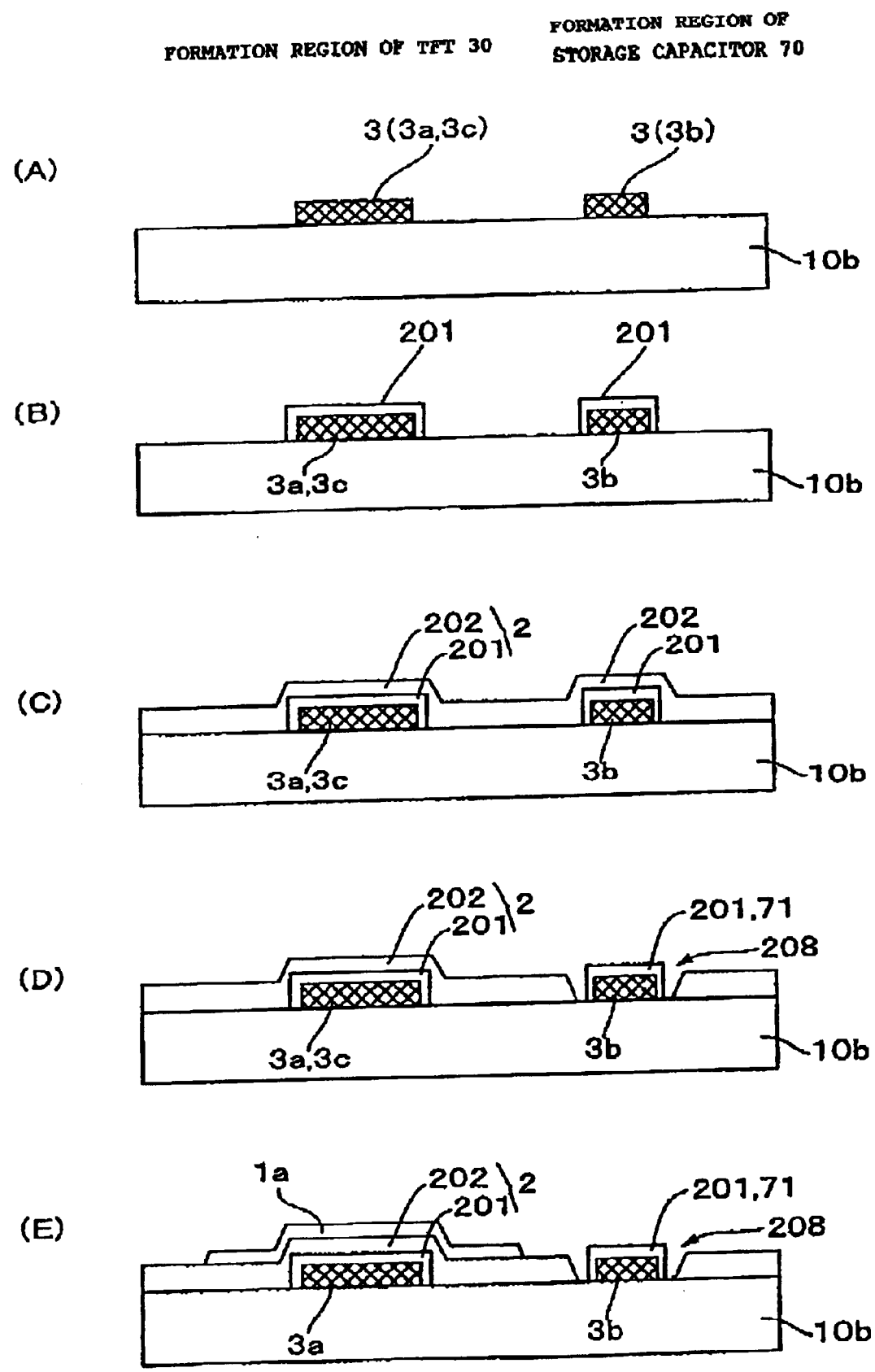
Figure 12:
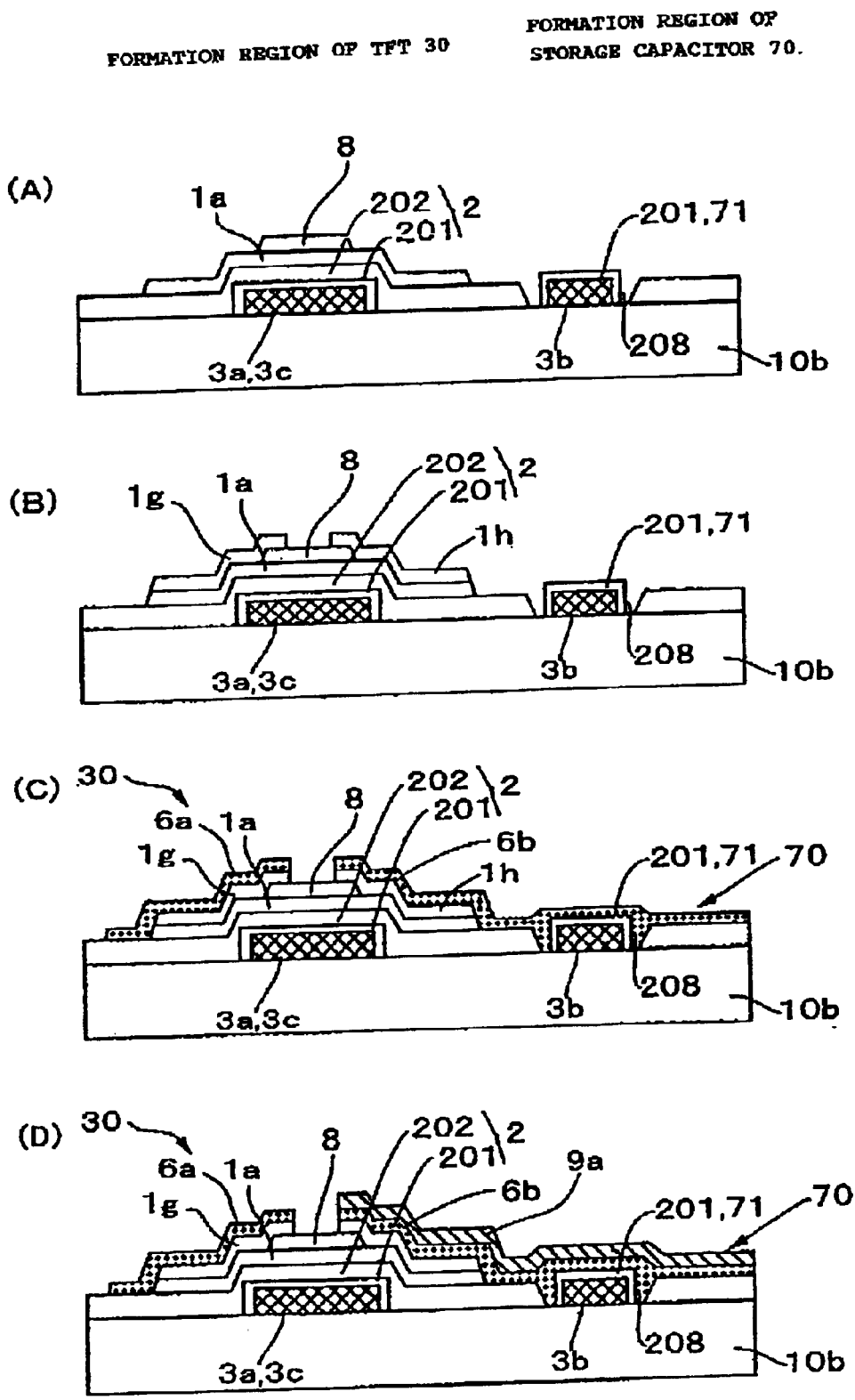
FIGS. 12(A) to 12(D) are sectional views respectively showing the steps after the steps shown in FIGS. 11(A)–11(E) in the method of manufacturing the active matrix substrate shown in FIG. 10.

FIG. 10 is a sectional view of a liquid crystal device of the ninth embodiment of the present invention, taken along a plane corresponding to plane A–A' in FIG. 6. FIGS. 11(A) to 11(E), and FIGS. 12(A) to 12(D) are sectional views respectively showing the steps of the method of manufacturing the active matrix substrate shown in FIG. 10.

In the eighth embodiment, each of the gate insulating films 2 of the TFTs 30 and the insulating layers 71 of the storage capacitors 70 includes the tantalum oxide film 201 and the silicon oxide film 202. However, in this embodiment, as shown in FIG. 10, each of the gate insulating films 2 includes the tantalum oxide film 201 and the silicon oxide film 202, while each of the insulating layers 71 includes only the tantalum oxide film 201.

Namely, in this embodiment, like in the eighth embodiment, each of the gate insulating films 2 includes the tantalum oxide film 201 formed by oxidizing the surface of the tantalum film used for the scanning lines 3a and the gate electrodes 3c, and the silicon oxide film 202 formed on the surface of the tantalum oxide film 201 by the CVD method or the like.

On the other hand, the capacity line 3b, (lower electrode) constituting each of the storage capacitors 70 includes the tantalum film, and the tantalum oxide film 201 formed by high-pressure annealing oxidation of the surface of the tantalum film constituting the capacity line 3b is formed on the capacity line 3b. However, in the region where each of the capacity lines 3b is formed, the silicon oxide film 202 is partially removed to form an aperture 208. Therefore, only the tantalum oxide film 201 serving as the insulating layer 71 is interposed between the capacity line 3b and the drain electrode 6b (upper electrode). Therefore, in this embodiment, the insulating layers 71 have a high dielectric constant, and thus the storage capacitors 70 having a high capacity can be formed. At each of the intersections of the capacity lines 3b and the data lines 6a, the silicon oxide film 202 is preferably left on each of the capacity lines 3b in consideration of the voltage resistance of the intersections.

The other construction is the same as the eighth embodiment, and thus the portions having the same functions as the eighth embodiment are denoted by the same reference numerals in FIG. 10, and a description thereof is omitted.

In manufacturing the active matrix substrate 10 having the above construction, as shown in FIG. 11(A), the transparent substrate 10b is first prepared as a base material of the active matrix substrate 10, and then a tantalum film 3 (insulating layer-forming metal film) is formed over the entire surface of the transparent substrate 10b by sputtering or the like. Then, the tantalum film 3 is patterned along the formation patterns of the scanning lines 3a, the gate electrodes 3c and the capacity lines 3b by a photolithography technique.

Next, the surface of the tantalum film 3 is annealed under high pressure in an atmosphere containing water vapor. The conditions of high-pressure annealing include a temperature of 600° C. or less, for example, 300° C. to 400° C., and a pressure of 0.5 MPa to 2 MPa. As a result, as shown in FIG. 11(B), only the surface of the tantalum film 3 is oxidized to form the tantalum oxide film 201, and thus the remainder of the tantalum film is used as each of the scanning lines 3a, the gate electrodes 3c and the capacity lines 3b.

After high-pressure annealing, annealing is further performed at a temperature 200° C. to 500° C. under atmospheric pressure or low pressure to remove moisture from the tantalum oxide film 201, thereby enhancing crystallinity, and thus enhancing the quality of the tantalum oxide film 201.

Next, as shown in FIG. 11(C), the silicon oxide film 202 is formed over the entire surface of the transparent substrate 10b by atmospheric-pressure or low-pressure CVD method or the like. Consequently, the gate insulating layers 2 each including the tantalum oxide film 201 and the silicon oxide film 202 are formed.

Next, as shown in FIG. 11(D), the silicon oxide film 202 formed on each of the capacity lines 3b is removed by the photolithography technique to form an aperture 208. Therefore, only the tantalum oxide film 201 left on each of the capacity lines 3b is used as the insulating layer 71 of the storage capacitor 70.

Then, like in the eighth embodiment, an amorphous silicon film is formed over the entire surface of the transparent substrate 10b, and then patterned by the photolithography technique to form island-like silicon films 1a on the gate insulating layers 2, as shown in FIG. 11(E). Next, a silicon oxide film is formed over the entire surface of the transparent substrate 10b, and then patterned by the photolithography technique to form etching stoppers 8 on the semiconductor films 1a, as shown in FIG. 12(A). Next, a silicon film doped with a N-type impurity is formed over the entire surface of the transparent substrate 10b by the CVD method or the like, and then patterned by the photolithography technique to form the source regions 1g and the drain regions 1h, as shown in FIG. 12(B).

Next, a conductive film, such as an aluminum film, is formed over the entire surface of the transparent substrate 1b by a sputtering method or the like, and then patterned by the photolithography technique to form the data line 6a and the drain electrode 6b, as shown in FIG. 12(C). In this step, the drain electrodes 6b are formed to partially overlap with the capacity lines 3b. As a result, the TFTs 30 and the storage capacitors 70 are formed. Next, an ITO film is formed over the entire surface of the transparent substrate 10b by the sputtering method or the like, and then patterned by the photolithography technique to form the pixel electrodes 9a, as shown in FIG. 12(D). Then, as shown in FIG. 10, the protective film 66 and the alignment film 64 are formed on the pixel electrodes 9a to complete the active matrix substrate 10.

[Tenth Embodiment]

A description will now be made of an active matrix substrate for a liquid crystal device as a semiconductor device according to a tenth embodiment of the present invention with reference to FIGS. 13–15(D).

Figure 13:
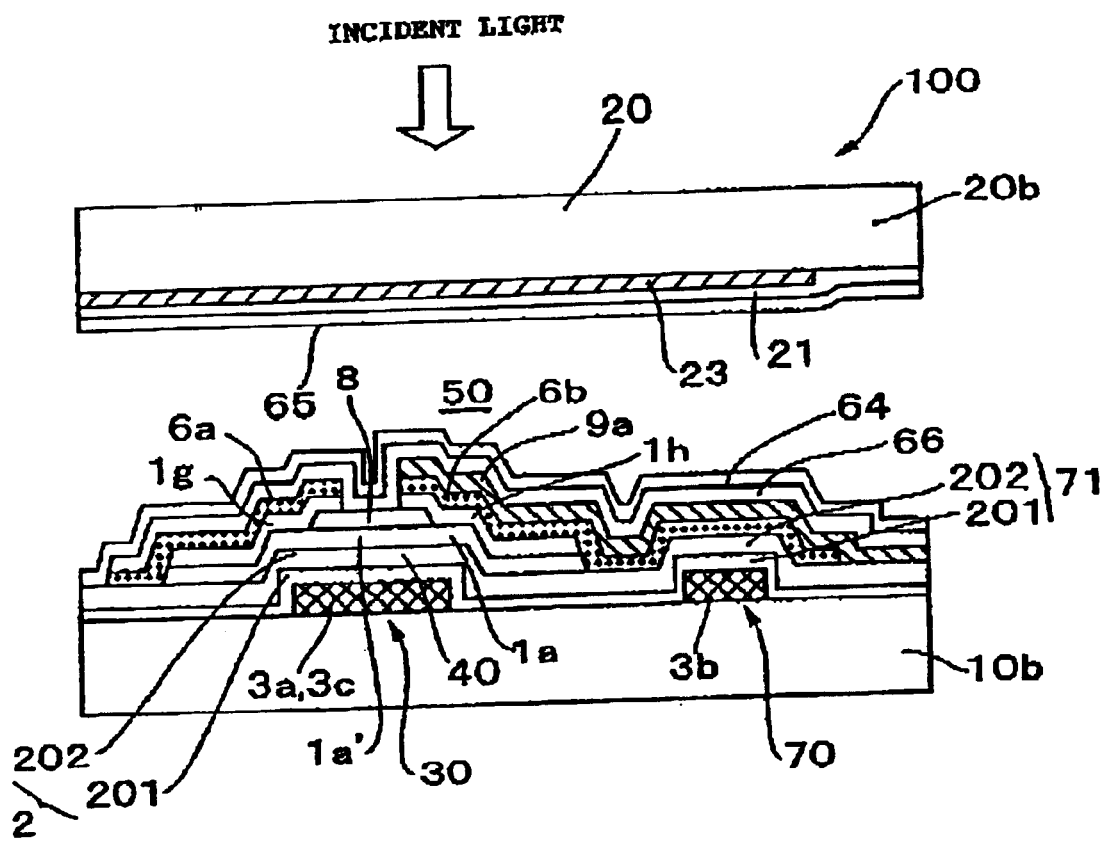
FIG. 13 is a sectional view of a liquid crystal device according to a tenth embodiment of the present invention taken along a plane corresponding to plane A–A' in FIG. 6.
Figure 14:
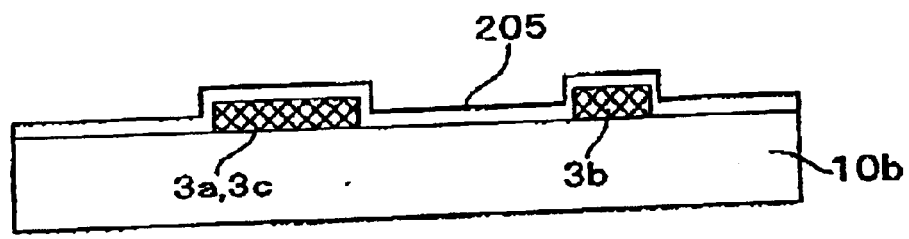
FIGS. 14(A) to 14(D) are sectional view respectively showing the steps of a method of manufacturing the active matrix substrate shown in FIG. 13.
Figure 14:
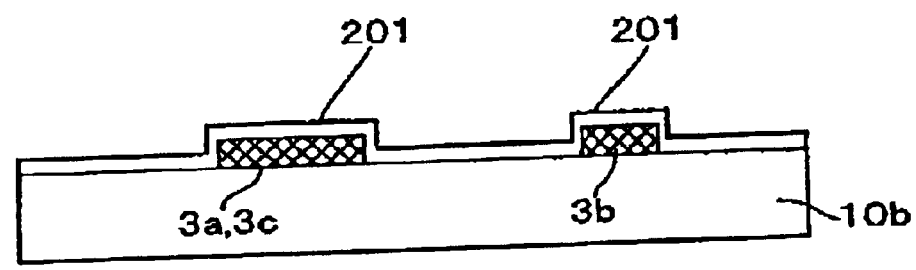
Figure 14:
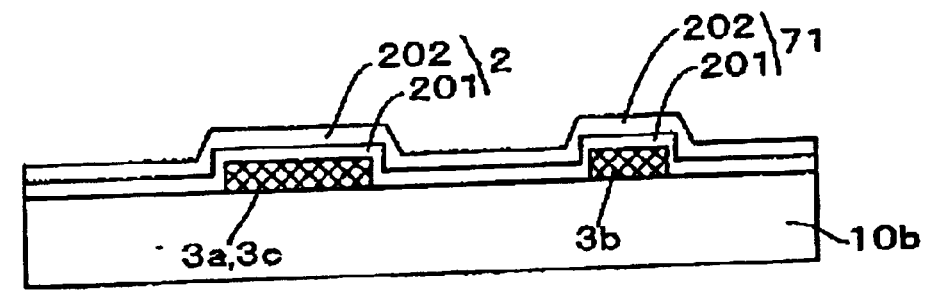
Figure 14:
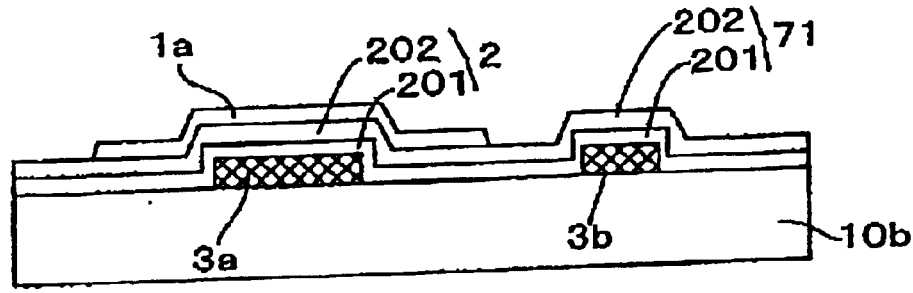
Figure 15:
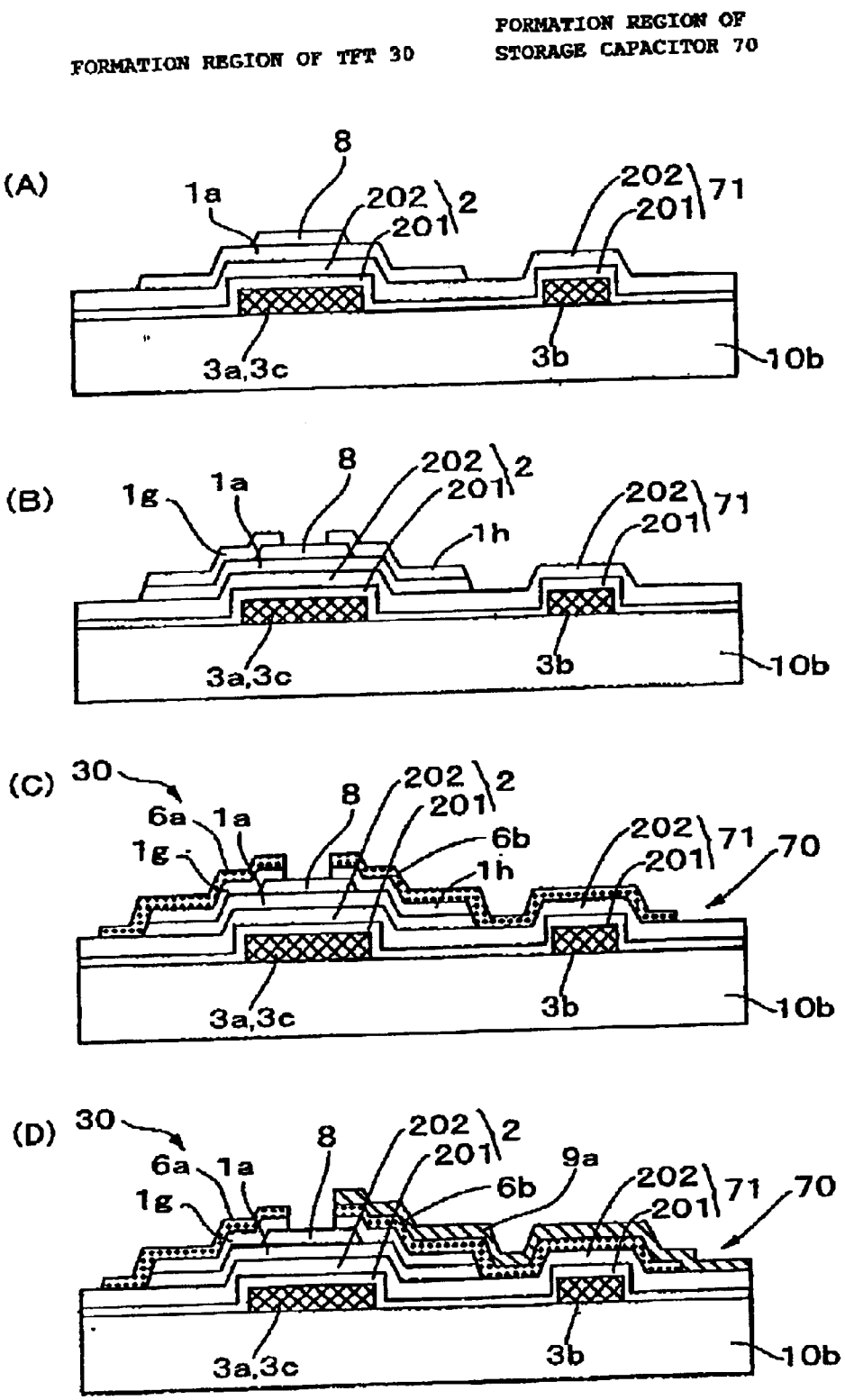
FIGS. 15(A) to 15(D) are sectional views respectively showing the steps after the steps shown in FIGS. 14(A)–14(D) in the method of manufacturing the active matrix substrate shown in FIG. 13.

FIG. 13 is a sectional view of a liquid crystal device of the tenth embodiment of the present invention, taken along a plane corresponding to plane A–A' in FIG. 6.

FIGS. 14(A)–14(D), and FIGS. 15(A)–15(D) are sectional views respectively showing the steps of the method of manufacturing the active matrix substrate shown in FIG. 13.

As shown in FIG. 13, a liquid crystal device 100 of this embodiment includes the active matrix substrate 10 and a counter substrate 20 disposed opposite to the substrate 10. In the active matrix substrate 10, a pixel switching TFT 30 is formed adjacent to each of pixel electrodes 9a, the TFT 30 including a MIS section in which a gate electrode 3c, a gate insulating layer 2, and an intrinsic silicon film 1a are formed in that order from the lower side to the upper side. In the active matrix substrate 10 of this embodiment, storage capacitors 70 each including an insulating layer 71 formed by using the same layer as the gate insulating layers 2 of the TFTs 30 are formed. In each of the storage capacitors 70, a capacity line 3b, the gate insulating layer 2 and a drain electrode 6b are formed in that order from the lower side to the upper side. In the counter substrate 20, a counter electrode 21 is formed over the entire surface, and an alignment film 65 subjected to predetermined orientation treatment, such as rubbing or the like, is formed on the surface of the counter electrode 21.

In the liquid crystal device 100 constituted as described above of this embodiment, each of the scanning lines 3a, the gate electrodes 3c and the capacity lines 3b includes a tantalum film or any of various metal films, for example, an aluminum film. Also, a tantalum oxide film 201 is formed over the entire surface of the transparent substrate 10b to cover the scanning lines 3a, the gate electrodes 3c and the capacity lines 3b, and used to form a part of each of the gate insulating layers 2 of the TFTs 30, and the insulating layers 71 of the storage capacitors 70. Namely, each of the gate insulating films 2 and the insulating layers 71 includes the tantalum oxide film 201 and the silicon oxide film 202 formed on the surface of the tantalum oxide film 201 by the CVD method or the like.

In this embodiment, in order to form the tantalum oxide film 201, a tantalum film is formed as an insulating layer-forming metal film over the entire surface of the transparent substrate 10b, and then entirely oxidized by high-pressure annealing under high pressure in an atmosphere containing water vapor, as described below. The conditions of high-pressure annealing include a temperature of 600° C. or less, for example, 300° C. to 400° C., and a pressure of 0.5 MPa to 2 MPa.

Therefore, in the active matrix substrate 10 of this embodiment, each of the gate insulating layers 2 and the insulating layers 71 includes the tantalum oxide film 201 formed by high-pressure annealing, and thus exhibits the same effect as the eighth embodiment in which the gate insulating layers 2 and the insulating layers 71 have high voltage resistance.

In forming the tantalum oxide film 201, the tantalum film formed over the entire surface of the transparent substrate 10b is entirely oxidized by high-pressure annealing to form the tantalum oxide film, and the tantalum oxide film is used as a part of each of the gate insulating layers 2 and the insulating layers 71. Therefore, unlike in the eighth and ninth embodiments, the gate electrodes 3c or the like can be formed by using a metal other than tantalum. Thus, the scanning lines 3a can be formed by using aluminum wiring, thereby decreasing the electric resistance of the scanning lines 3a.

In manufacturing the active matrix substrate 10 for the liquid crystal display device having the above construction, as shown in FIG. 14(A), the transparent substrate 10b is first prepared as a base material of the active matrix substrate 10, and then an aluminum film is formed over the entire surface of the transparent substrate 10b by sputtering or the like. Then, the aluminum film is patterned by the photolithography technique to form the scanning lines 3a, the gate electrodes 3c and the capacity lines 3b.

Next, a tantalum film 205 (insulating layer-forming metal film) is formed over the entire surface of the transparent substrate 10b by sputtering to cover the scanning lines 3a, the gate electrodes 3c and the capacity lines 3b.

Then, the tantalum film 205 is entirely annealed under high pressure in an atmosphere containing water vapor. The conditions of high-pressure annealing include a temperature of 600° C. or less, for example, 300° C. to 400° C., and a pressure of 0.5 MPa to 2 MPa. As a result, as shown in FIG. 14(B), the tantalum film 205 is entirely oxidized to form the tantalum oxide film 201.

After high-pressure annealing, annealing is further performed at a temperature of 200° C. to 500° C. under atmospheric pressure or low pressure to remove moisture from the tantalum oxide film 201, thereby enhancing crystallinity and thus improving the quality of the tantalum oxide film 201.

Next, as shown in FIG. 14(C), the silicon oxide film 202 is formed over the entire surface of the transparent substrate 10b by the CVD method or the like. Consequently, the gate insulating layers 2 and the insulating layers 71 each including the tantalum oxide film 201 and the silicon oxide film 202 are formed.

Thereafter, like in the eighth embodiment, an amorphous silicon film is formed over the entire surface of the transparent substrate 10b, and then patterned by the photolithography technique to form island-like silicon films 1a on the gate insulating layers 2, as shown in FIG. 14(D). Next, a silicon oxide film is formed over the entire surface of the transparent substrate 10b, and then patterned by the photolithography technique to form etching stoppers 8 on the semiconductor films 1a, as shown in FIG. 15(A). Next, a silicon film doped with a N-type impurity is formed over the entire surface of the transparent substrate 10b by the CVD method or the like, and then patterned by the photolithography technique to form the source regions 1g and the drain regions 1h, as shown in FIG. 15(B).

Next, a conductive film, such as an aluminum film, is formed over the entire surface of the transparent substrate 1b by a sputtering method or the like, and then patterned by the photolithography technique to form the data lines 6a and the drain electrodes 6b, as shown in FIG. 15(C). In this step, the drain electrodes 6b are formed to partially overlap with the capacity lines 3b. As a result, the TFTs 30 and the storage capacitors 70 are formed. Next, an ITO film is formed over the entire surface of the transparent substrate 10b by the sputtering method or the like, and then patterned by the photolithography technique to form the pixel electrodes 9a, as shown in FIG. 15(D). Then, as shown in FIG. 13, the protective film 66 and the alignment film 64 are formed on the pixel electrodes 9a to complete the active matrix substrate 10.

[Eleventh Embodiment]

A description will now be made of an active matrix substrate for a liquid crystal device as a semiconductor device according to an eleventh embodiment of the present invention with reference to FIGS. 16–18(D).

Figure 16:
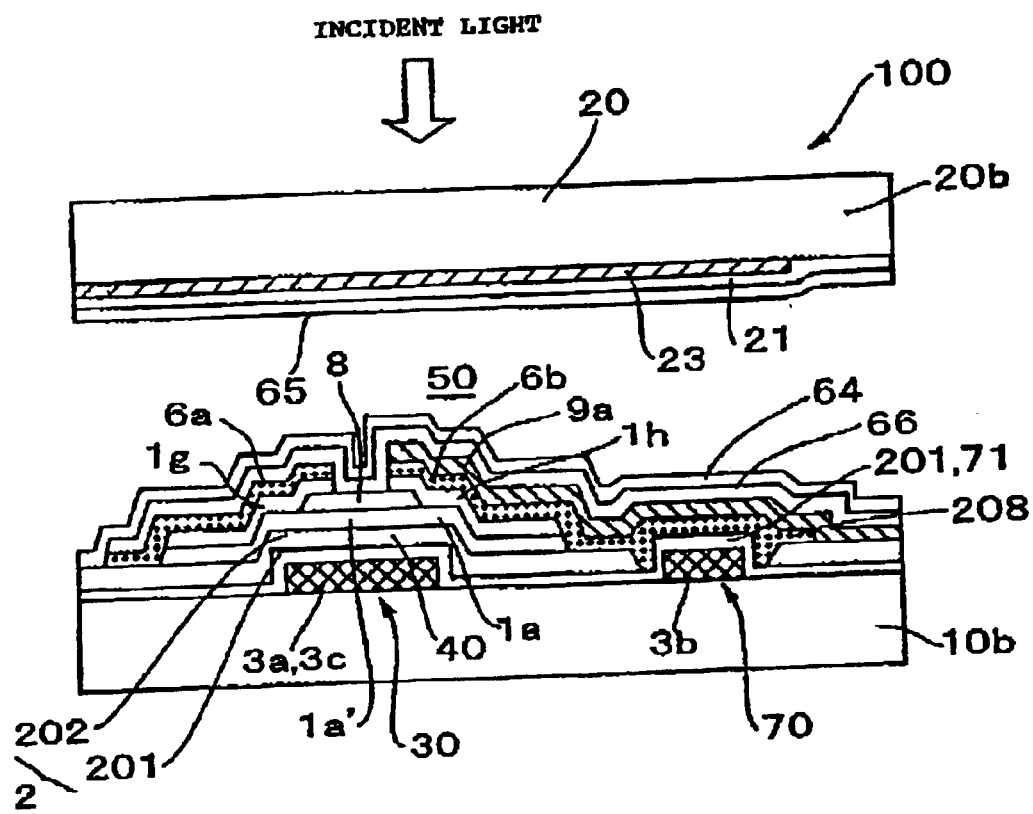
FIG. 16 is a sectional view of a liquid crystal device according to an eleventh embodiment of the present invention taken along a plane corresponding to plane A–A' in FIG. 6.
Figure 17:
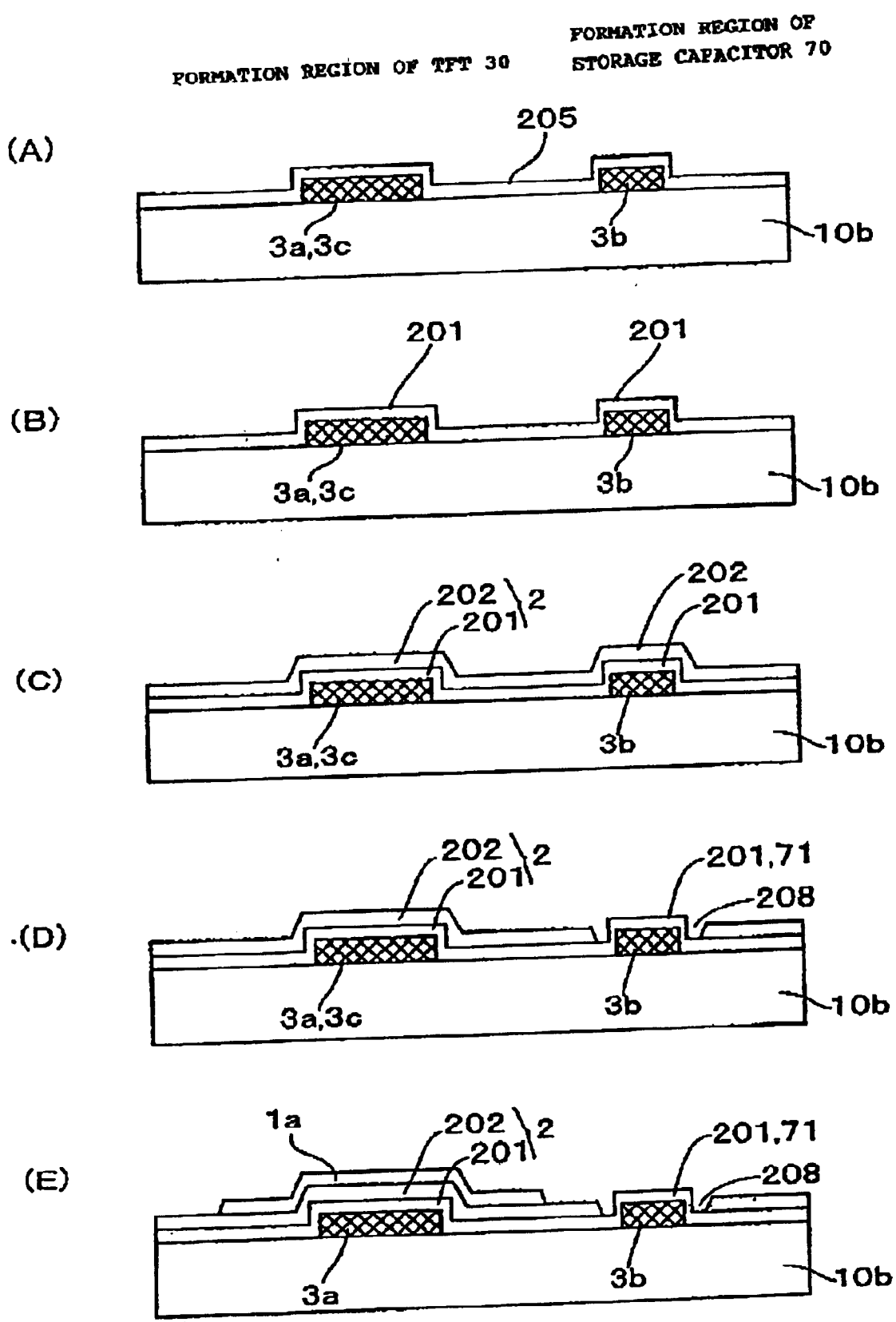
FIGS. 17(A) to 17(E) are sectional views respectively showing the steps of a method of manufacturing the active matrix substrate shown in FIG. 16.
Figure 18:
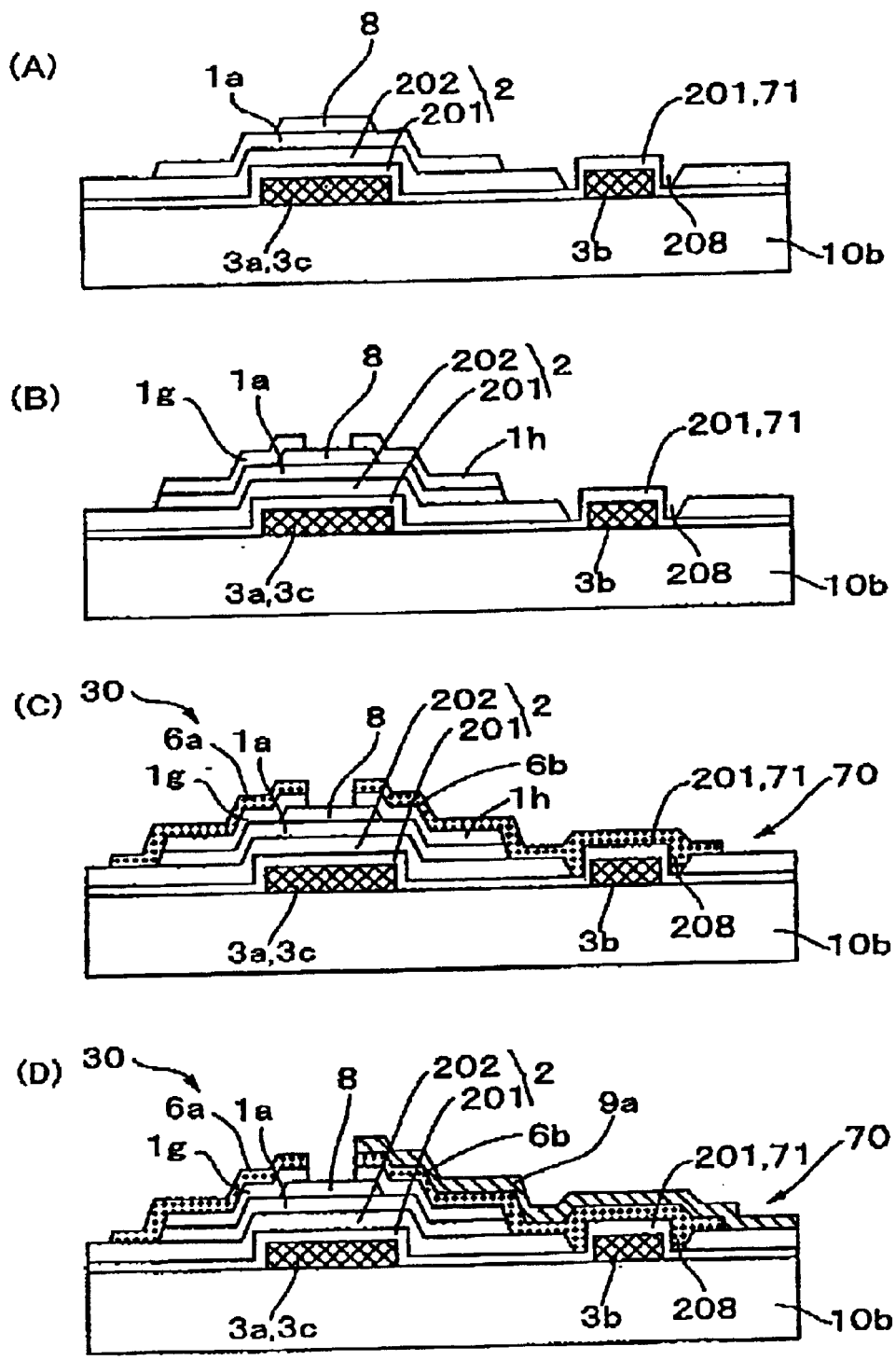
FIGS. 18(A) to 18(D) are sectional views respectively showing the steps after the steps shown in FIGS. 17(A)–17(E) in the method of manufacturing the active matrix in FIG. 16.

FIG. 16 is a sectional view of a liquid crystal device of the eleventh embodiment of the present invention, taken along a plane corresponding to plane A–A' in FIG. 6. FIGS. 17(A)

to 17(E), and FIGS. 18(A) to 18(D) are sectional views respectively showing the steps of the method of manufacturing the active matrix substrate shown in FIG. 16.

In the tenth embodiment, each of the gate insulating layers 2 of the TFTs 30 and the insulating layers 71 of the storage capacitors 70 includes the tantalum oxide film 201 and the silicon oxide film 202. However, in this embodiment, as shown in FIG. 16, each of the gate insulating films 2 includes the tantalum oxide film 201 and the silicon oxide film 202, while each of the insulating layers 71 includes only the tantalum oxide film 201.

Namely, in this embodiment, like in the tenth embodiment, each of the gate insulating films 2 includes the tantalum oxide film 201 formed by high-pressure annealing oxidization of the whole of the tantalum film formed on the scanning lines 3a and the gate electrodes 3c, and the silicon oxide film 202 formed on the surface of the tantalum oxide film 201 by the CVD method or the like.

However, each of the storage capacitors 70 includes the tantalum oxide film 201 formed on the capacity line 3b (lower electrode) by high-pressure annealing oxidization of the entire tantalum film formed on the capacity lines 3b, and in the region where each of the capacity lines 3b is formed, the silicon oxide film is partially removed to form an aperture 208. Therefore, only the tantalum oxide film 201 serving as the insulating layer is present between the capacity line 3b and the drain electrode 6b (upper electrode). Therefore, in this embodiment, the insulating layers 71 have a high dielectric constant, and thus the storage capacitors 70 having a large capacity can be formed. In each of the intersections of the capacity lines 3b and the data lines 6b, the silicon oxide film 202 is preferably left even on the capacity line 3b in consideration of voltage resistance. Since the other configuration is the same as the tenth embodiment, the portions having the same functions as the tenth embodiment are denoted in FIG. 13 by the same reference numerals, and a description thereof is omitted.

In manufacturing the active matrix substrate 10 having the above construction, as shown in FIG. 17(A), the transparent substrate 10b is first prepared as a base material of the active matrix substrate 10, and then an aluminum film is formed over the entire surface of the transparent substrate 10b by sputtering or the like. Then, the aluminum film is patterned by the photolithography technique to form the scanning lines 3a, the gate electrodes 3c and the capacity lines 3b.

Next, a tantalum film 205 (insulating layer-forming metal film) is formed over the entire surface of the transparent substrate 10b by sputtering or the like to cover the scanning lines 3a, the gate electrodes 3c and the capacity lines 3b.

Then, the tantalum film 205 is entirely annealed under high pressure in an atmosphere containing water vapor. The conditions of high-pressure annealing include a temperature 600° C. or less, for example, 300° C. to 400° C., and a pressure of 0.5 MPa to 2 MPa. As a result, as shown in FIG. 17(B), the tantalum film 205 is entirely oxidized to form the tantalum oxide film 201.

After high-pressure annealing, annealing is further performed at a temperature of 200° C. to 500° C. under atmospheric pressure or low pressure to remove or substantially remove moisture from the tantalum oxide film 201, thereby enhancing crystallinity, and thus enhancing the quality of the tantalum oxide film 201.

Next, as shown in FIG. 17(C), the silicon oxide film 202 is formed over the entire surface of the transparent substrate 10b by the atmospheric-pressure, low-pressure CVD method or the like. Consequently, the gate insulating layers 2 each including the tantalum oxide film 201 and the silicon oxide film 202 are formed.

Next, as shown in FIG. 17(D), the silicon film 202 formed on each of the capacity lines 3b is removed by the photolithography technique to form an aperture 108. Therefore, only the tantalum oxide films 201 left on the capacity lines 3b are respectively used as the insulating layers 71 of the storage capacitors 70.

Thereafter, like in the eighth embodiment, an amorphous silicon film is formed over the entire surface of the transparent substrate 10b, and then patterned by the photolithography technique to form island-like silicon films 1a on the gate insulating layers 2, as shown in FIG. 17(E). Next, a silicon oxide film is formed over the entire surface of the transparent substrate 10b, and then patterned by the photolithography technique to form etching stoppers 8 on the semiconductor films 1a, as shown in FIG. 18(A). Next, a silicon film doped with a N-type impurity is formed over the entire surface of the transparent substrate 10b by the CVD method or the like, and then patterned by the photolithography technique to form the source regions 1g and the drain regions 1h, as shown in FIG. 18(B).

Next, a conductive film such as an aluminum film is formed over the entire surface of the transparent substrate 10b by a sputtering method or the like, and then patterned by the photolithography technique to form the data lines 6a and the drain electrodes 6b, as shown in FIG. 18(C). In this step, the drain electrodes 6b are formed to partially overlap with the capacity lines 3b. As a result, the TFTs 30 and the storage capacitors 70 are formed. Next, an ITO film is formed over the entire surface of the transparent substrate 10b by the sputtering method or the like, and then patterned by the photolithography technique to form the pixel electrodes 9a, as shown in FIG. 18(D). Then, as shown in FIG. 16, the protective film 66 and the alignment film 64 are formed on the pixel electrodes 9a to complete the active matrix substrate 10.

In the eighth, ninth, tenth and eleventh embodiments, like in the second embodiment, a lower electrode layer made of aluminum or the like may be formed below a tantalum film.

[Twelfth Embodiment]

In the eighth, ninth, tenth and eleventh embodiments, an inverted-staggered TFT is formed as a pixel switching nonlinear element. However, like in this embodiment, the present invention may be applied to an active matrix substrate using a normally-staggered TFT as a pixel switching element. Since the basic configurations of an active matrix substrate of this embodiment and a liquid crystal device using the active matrix substrate are the same as eighth embodiment, portions having the same functions as the eighth embodiment are denoted by the same reference numerals, and a description thereof is omitted.

(Construction of Active Matrix Substrate)

Figure 19:
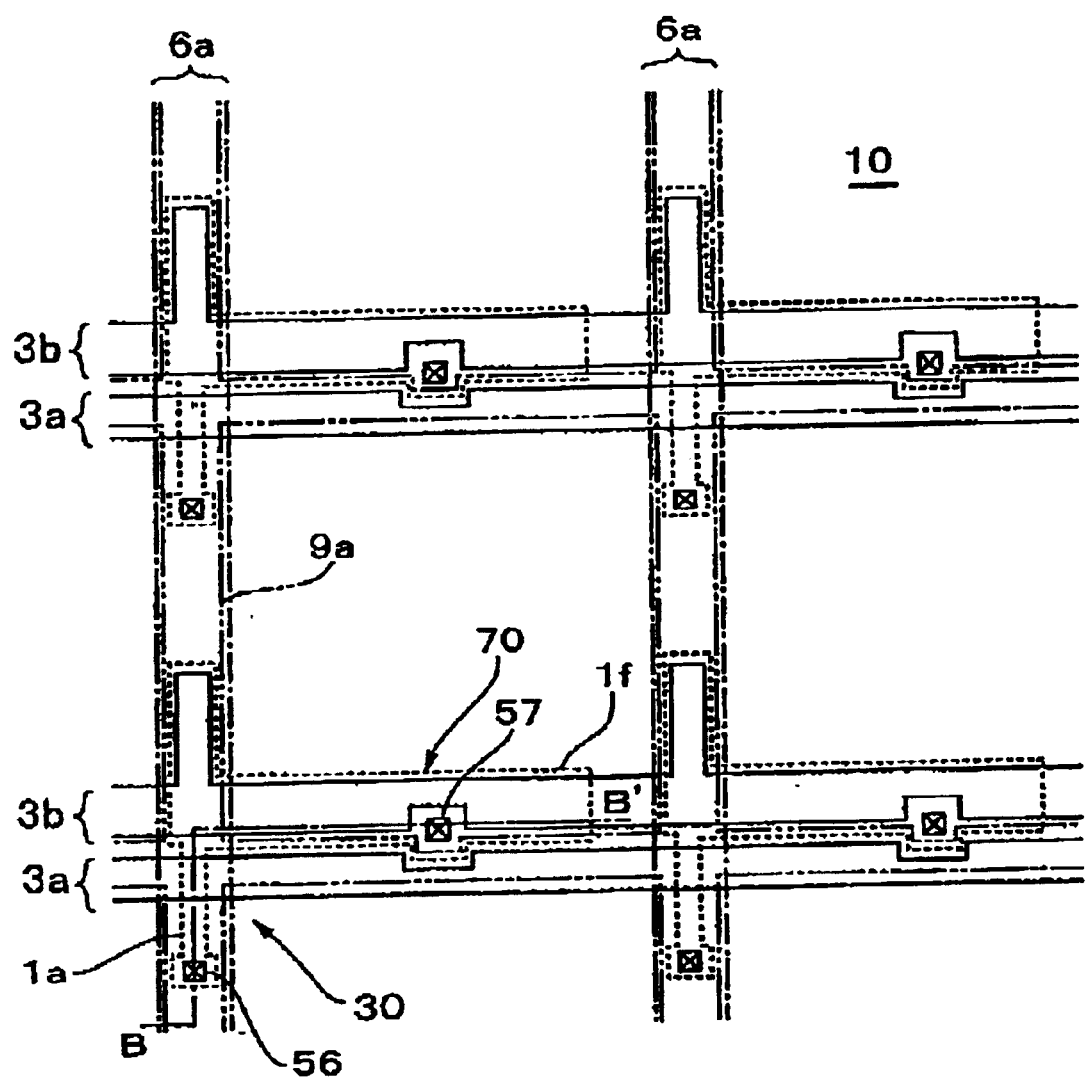
FIG. 19 is a plan view showing a configuration of pixels formed on an active matrix substrate in a liquid crystal device according to a twelfth embodiment of the present invention.
Figure 20:
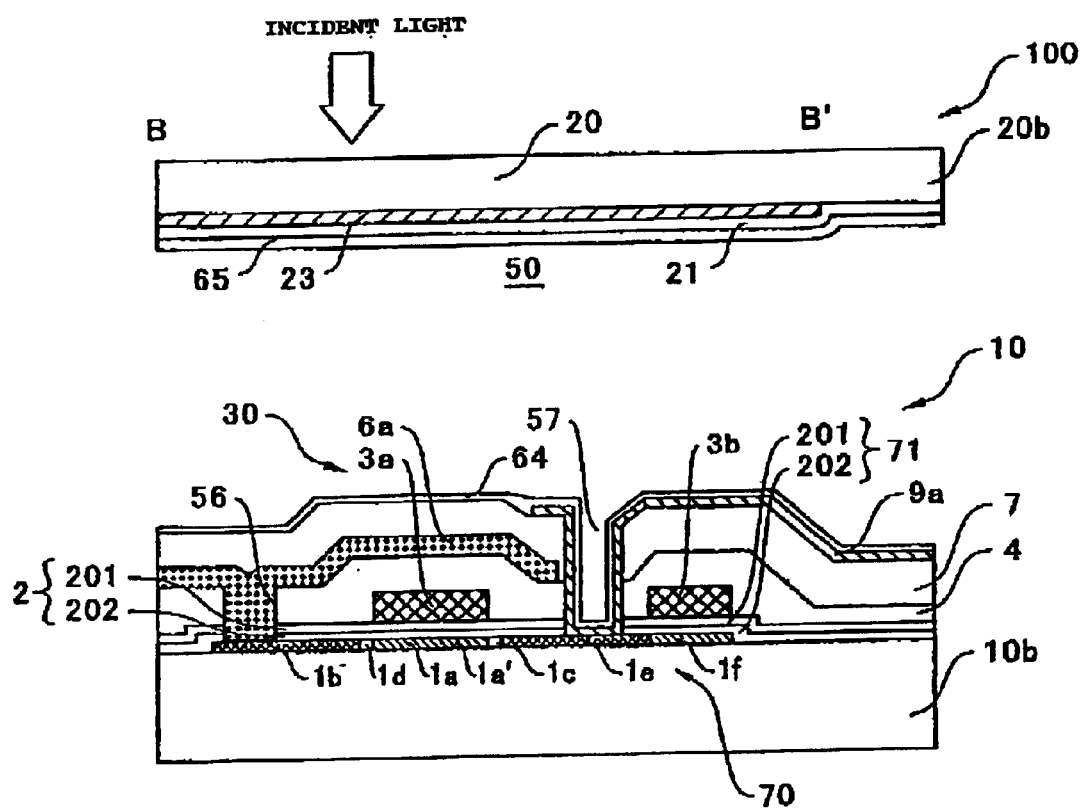
FIG. 20 is a sectional view of the liquid crystal device according to the twelfth embodiment of the present invention taken along plane B–B' in FIG. 19.

FIG. 19 is a plan view of adjacent pixels on an active matrix substrate on which data lines, scanning lines, pixel electrodes, etc. are formed. FIG. 20 is a sectional view taken along plane B–B' in FIG. 19, illustrating a state in which a liquid crystal as an electro-sealed optic material is sealed between the active matrix substrate and a counter substrate. In these figures, in order to make the size of each of layers and members recognizable, the layers and members are shown on different contraction scales.

In FIG. 19, a plurality of the transparent pixel electrodes 9a (regions surrounded by two-dot chain lines) are formed for the respective pixels in a matrix on the active matrix substrate 10 of a liquid crystal device 100, and the data lines 6a (shown by one-dot chain lines), scanning lines 3a (metal layers, shown by solid lines) and the capacity lines 3b (metal layers, shown by solid lines) are formed along the longitudinal and lateral. boundary regions of the pixel electrodes 9a. The data lines 6a are electrically connected to the source regions of the semiconductor layers 1a each including a polysilicon film, through contact holes 56, and the pixel electrodes 9a are electrically connected to the drain regions of the semiconductor layers 1a through contact holes 57. In each of the semiconductor layers 1a corresponding scanning line 3a is formed to face a channel-forming region described below.

As shown in FIG. 20, the liquid crystal device 100 includes the active matrix substrate 10 and a counter substrate 20 disposed opposite to the substrate 10. The base material of this active matrix substrate 10 includes a transparent base plate 10b, such as a quartz plate or a heat-resistance glass plate, and the base material of this counter substrate 20 also includes a transparent base plate 20b, such as a quartz plate or a heat-resistance glass plate. The pixel electrodes 9a are formed on the active matrix substrate 10, and an alignment film 64 subjected to predetermined orientation treatment, such as rubbing, is formed on the pixel electrodes 9a. Each of the pixel electrodes 9a includes a transparent conductive thin film, for example, an ITO film, or the like. The alignment film 64 includes an organic thin film, for example, a polyimide thin film, or the like.

In the active matrix substrate 10, the pixel switching TFT 30 is formed adjacent to each of the pixel electrodes 9a, to control switching of the pixel electrode 9a. Each of the TFTs 30 is a LDD (Lightly Doped Drain) structure including the scanning line 3a, a channel forming region 1a' (semiconductor layer) of a semiconductor film 1a in which a channel is formed by an electric field of a scanning signal supplied from the scanning line 3a, the gate insulating layer 2 to insulate the scanning line 3a from the semiconductor layer 1a, the data line 6a, a low-concentration source region 1b and low-concentration drain region 1c f the semiconductor layer 1a, and a high-concentration source region 1d and high-concentration drain region 1e of the semiconductor layer 1a.

Furthermore, an interlayer insulating film 4 is formed on the scanning lines 3a, and the data lines 6a are formed on the interlayer insulating film 4. Therefore, the data lines 6a are electrically connected to the high-concentration source regions 1d through the contact holes 56 formed in the interlayer insulating film 4. Furthermore, an interlayer insulating film 7 is formed on the data lines 6, and the pixel electrodes 9a are formed on the interlayer insulating film 7. Therefore, the pixels electrodes 9a are connected to the high-concentration drain regions 1e through the contact holes 57 formed in the interlayer insulating films 4 and 7 and the gate insulating layers 2.

Although the TFTs 30 preferably have the above-described LDD structure, the TFTs 30 may have an offset structure in which an impurity ion is not implanted into regions corresponding to the low-concentration source region 1b and the low-concentration drain region 1c. Alternatively, the TFTs 30 may be self-aligned TFTs in which a high concentration of impurity ion is implanted using the gate electrodes 3a as a mask to form high-concentration source and drain regions in self alignment.

In this embodiment, a storage capacitor 70 includes an insulating layer 71 formed by extending the gate insulating layer 2 of each of the TFTs 30 from a position facing the gate electrode 3a, a lower electrode 1f formed by extending each of the semiconductor films 1a, and the capacity line 3b as an upper electrode facing these layers. Namely, the high-concentration drain region 1e of each of the semiconductor films 1a is formed opposite to the corresponding capacity line 3b through the gate insulating layer 2 and used as the lower electrode 1f of each storage capacitor 70.

On the other hand, in the counter substrate 20, a counter electrode 21 is formed over the entire surface, and an alignment film 65 subjected to orientation treatment, such as rubbing or the like, is formed on the surface of the counter electrode 21. The counter electrode 21 also includes a transparent conductive thin film, for example, an ITO film or the like. The alignment film 65 of the counter substrate 20 also includes an organic thin film such as a polyimide thin film or the like. Also, a counter substrate-side light shielding film 23 is formed in a matrix shape on the counter substrate 20, except an aperture region of each of the pixels.

In the liquid crystal device 100 having the above construction, each of the gate insulating films 2 includes the silicon oxide film 202 formed on the semiconductor film 1a by CVD method or the like, and the tantalum oxide film 201 formed by oxidizing a tantalum film formed on the silicon oxide film 202. Each of the insulating layers 71 also comprises the silicon oxide film 202 formed on the semiconductor film 1a by CVD method or the like, and the tantalum oxide film 201 formed by oxidizing the tantalum film formed on the silicon oxide film 202.

In forming the tantalum oxide film 201, the tantalum film is formed as an insulating layer-forming metal film over the entire surface of the transparent substrate 10b to cover the silicon oxide film 202 as described below, and then the tantalum film is entirely oxidized by high-pressure annealing under high pressure in an atmosphere containing water vapor. The conditions of high-pressure annealing include a temperature of 600° C. or less, for example, a temperature of 300° C. to 400° C., and a pressure of 0.5 MPa to 2 MPa.

Therefore, in the active matrix substrate 10 of this embodiment, each of the gate insulating layers 2 and the insulating layers 71 contains the tantalum oxide film 201 formed by high-pressure annealing, and thus this embodiment has the same effect as the eight embodiment in which the gate insulating layers 2 and the insulating layers 71 have high voltage resistance.

In forming the tantalum oxide film 201, the tantalum film formed over the entire surface of the transparent substrate 10b is entirely oxidized by high-pressure annealing to form the tantalum oxide film used as a part of each of the gate insulating layers 2 and the insulating layers 71. Namely, not only the surface of the tantalum film is oxidized to form the tantalum oxide film 201.

Therefore, the tantalum film is not left after the tantalum oxide film 201 is formed, and in the normally-staggered TFTs 30, the tantalum oxide film 201 can thus be contained in each of the gate insulating layers 2 and the insulating layers 71. Since not only the tantalum film but also any desired metal film can be used for the scanning lines 3a, a metal film having low electric resistance, such as an aluminum film, can be formed.

(Method of Manufacturing the Active Matrix Substrate)

Figure 22:
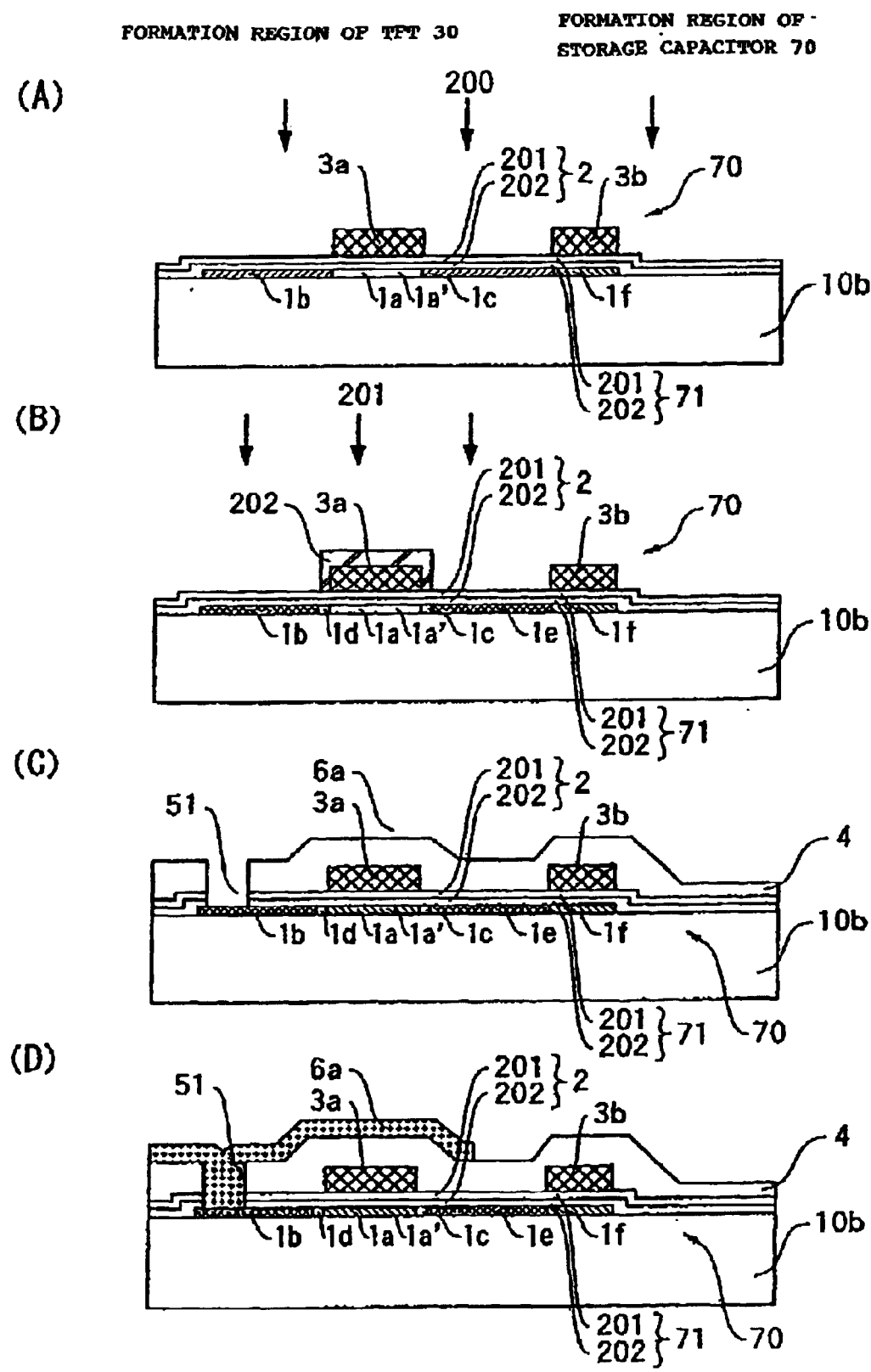
FIGS. 22(A) to 22(D) are sectional views respectively showing the steps after the steps shown in FIGS. 21(A)–21(D) in the method of manufacturing the active matrix substrate shown in FIGS. 19 and 20.
Figure 23:
FIGS. 23(A) and 23(B) are sectional views respectively showing the steps after the steps shown in FIGS. 22(A)–22(D) in the method of manufacturing the active matrix in FIGS. 19 and 20.
Figure 23:
Figure 23:
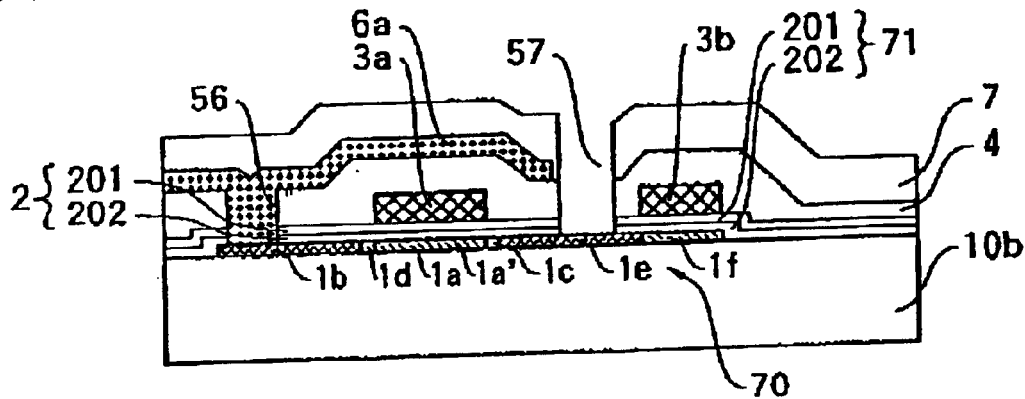
Figure 23:
Figure 23:
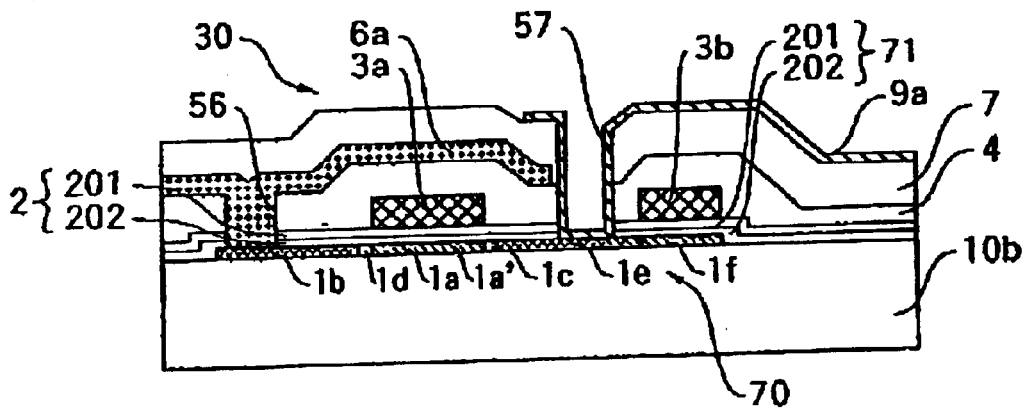

The method of manufacturing the active matrix substrate 10 for the liquid crystal display having the above-described construction will be described below with reference to FIGS. 21, 22 and 23.

Figure 21:
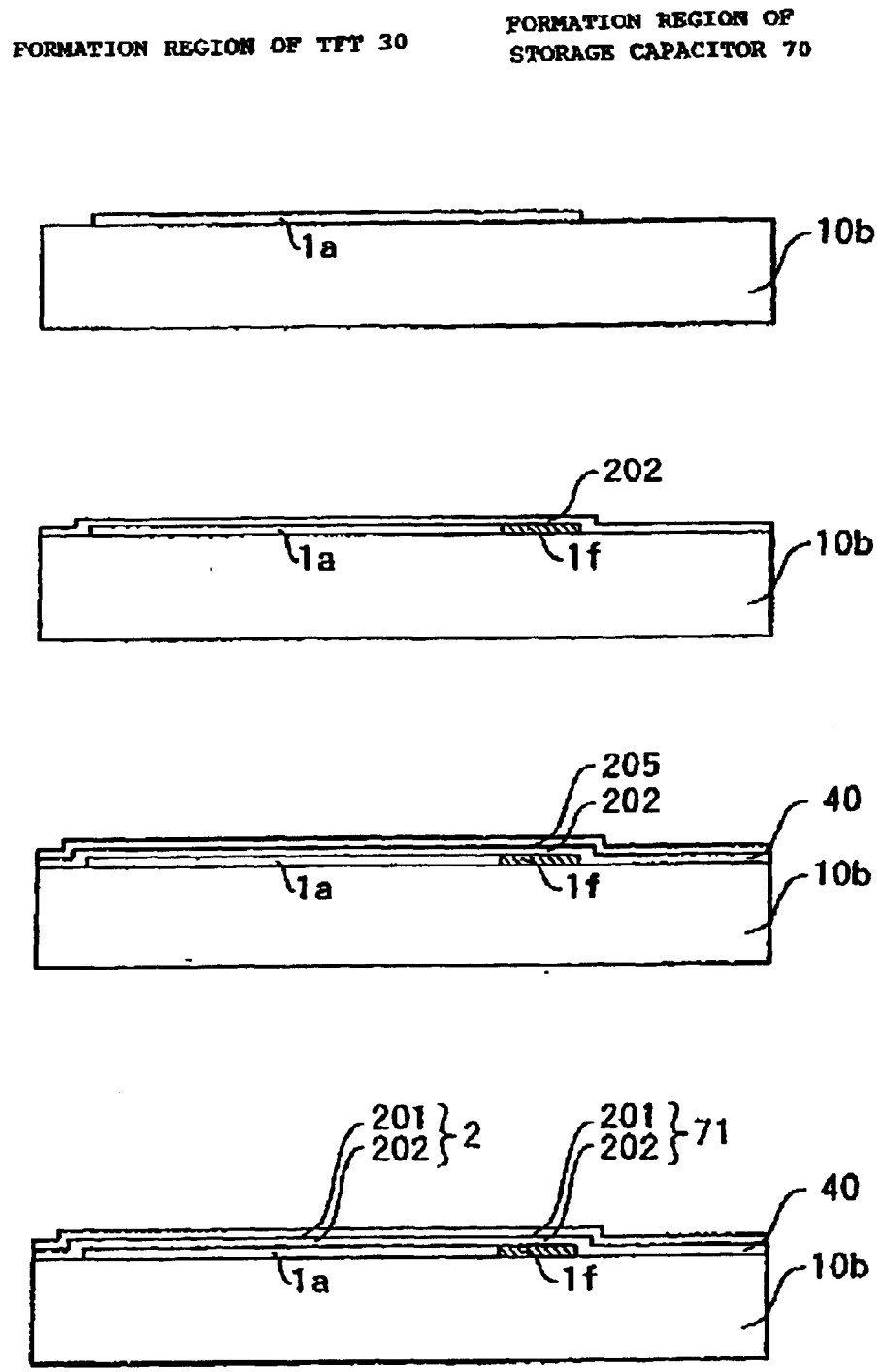
FIGS. 21 (A) to 21 (D) are sectional views respectively showing the steps of a method of manufacturing the active matrix substrate shown in FIGS. 19 and 20.

FIGS. 21 (A)–23(B) are sectional views respectively showing the steps of the method of manufacturing the active matrix substrate 10 of this embodiment, taken along a plane corresponding to plane B–B' in FIG. 19.

As shown in FIG. 21(A), an underlying protective film (not shown) is formed over the entire surface of a transparent substrate 10b used as the base material of the active matrix substrate 10, and then an amorphous silicon film is formed on the underlying protective film at a temperature of about 450° C. to 550° C. by the low-pressure CVD method using a monosilane gas, a disilane gas, or the like. Then, the amorphous silicon film is annealed at about 600° C. for about 1 to 10 hours in a nitrogen atmosphere to form a polysilicon film by solid-phase growth, and the polysilicon film is patterned by the photolithography technique to form island-like silicon films 1a.

Next, as shown in FIG. 21(B), the silicon oxide film 202 is formed over the entire surface of the transparent substrate 10b by the CVD method. Then, a portion of the silicon film 1a, which correspond to the lower electrode 1f of each of the storage capacitors 70, is doped with, for example, P ions in a dose of about $3 \times 10^{12}/cm^2$ to decrease the electric resistance.

Next, as shown in FIG. 21(C), a tantalum film 205 (insulating layer-forming metal film) is formed over the entire surface of the transparent substrate 10b by sputtering or the like to cover the silicon oxide film 202.

Next, the tantalum film 205 is entirely annealed under high pressure in an atmosphere containing water vapor. The conditions of high-pressure annealing include a temperature of 600° C. or less, for example, 300° C. to 400° C., and a pressure of 0.5 MPa to 2 MPa. As a result, as shown in FIG. 21(D), the surface of the tantalum film 205 is entirely oxidized to form the tantalum oxide film 201, and thus the gate insulating layer 2 and the insulating layer 71 each including the silicon oxide film 202 and the tantalum oxide film 201 are formed.

After high-pressure annealing, annealing is further performed at a temperature of 200° C. to 500° C. under atmospheric pressure or low pressure to remove or substantially remove moisture from the tantalum oxide film 201, thereby enhancing crystallinity, and thus enhancing the quality of the tantalum oxide film 201.

Next, an aluminum film is formed over the entire surface of the transparent substrate 10b the sputtering method to cover the gat insulating layer 2, and then patterned by the photolithography technique to form the scanning lines 3a and the capacity lines 3b, as shown in FIG. 22(A).

Next, in order to form a N-channel TFT having the LDD structure as each of the TFTs 30, the semiconductor layer 1a is doped with a V-group element such as P or the like, as a dopant 200, at a low concentration (for example, P ions in a dose of $1 \times 10^{13}/cm^2$ to $3 \times 10^{13}/cm^2$) by using the corresponding scanning line 3a as a diffusion mask to form the low-concentration source region source region 1b and the low-concentration drain region 1c. As a result, the channel-forming region 1a' is formed in the portion of the semiconductor layer 1a, which is positioned below the scanning line 3a.

Next, as shown in FIG. 22(B), in order to form the high-concentration source region 1d and the high-concentration drain region 1e of each of the TFTs 30, a resist mask 202 wider than the scanning line 3a is formed on the scanning line 3a, and then a V-group element such as P is implanted as dopant 202 at a high concentration. The TFTs 30 may be offset-structure TFTs formed without doping with a low concentration of ion, or self-aligned TFTs formed by an ion implantation process using P ions, B ions, or the like and the scanning line 3a (gate electrodes) as a mask.

Next, as shown in FIG. 22(C), an interlayer insulating film 4 including a silicon oxide film is formed to cover the scanning lines 3a and the capacity lines 3b. Next, the contact holes 56 are formed in the interlayer insulating film 4 by dry etching such as reactive ion etching, reaction ion beam etching, or the like, or wet etching.

Next, an aluminum film is formed over the entire surface of the transparent substrate 10b cover the interlayer insulating film 4, and then patterned by the photolithography technique to form the data lines 6a, as shown in FIG. 22(D).

Next, as shown in FIG. 23(A), an interlayer insulating film 7 including a silicon oxide film is formed to cover the data lines 6a. Next, the contact holes 57 are formed in the interlayer insulating films 7 and 4, and the gate insulating layers 2 by dry etching, such as reactive ion etching, reaction ion beam etching, or the like, or wet etching.

Next, an ITO film is formed over the entire surface of the transparent substrate 10b by the sputtering method or the like to cover the interlayer insulating film 7, and then patterned by the photolithography technique to form the pixel electrodes 9a, as shown in FIG. 23(B).

Then, as shown in FIG. 20, a coating solution of a polyimide alignment film is coated on the pixel electrodes 9a, and then rubbed in a predetermined direction with a predetermined pre-tilt angle to form the alignment film 64, completing the active matrix substrate 10.

[Thirteenth Embodiment]

A description will now be made of an active matrix substrate for a liquid crystal device as a semiconductor device according to a thirteenth embodiment of the present invention with reference to FIGS. 24–27(B).

Figure 24:
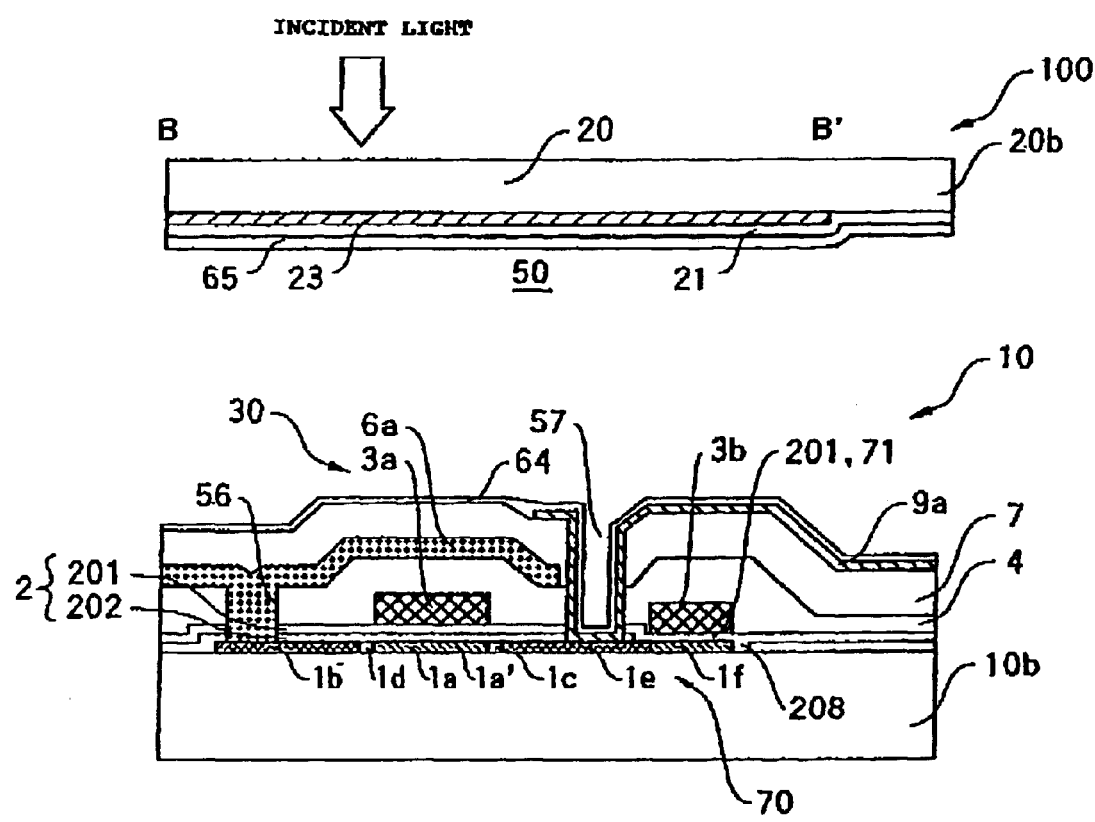
FIG. 24 is a sectional view of a liquid crystal device according to a thirteenth embodiment of the present invention taken along a plane corresponding to plane B–B' in FIG 19.
Figure 25:
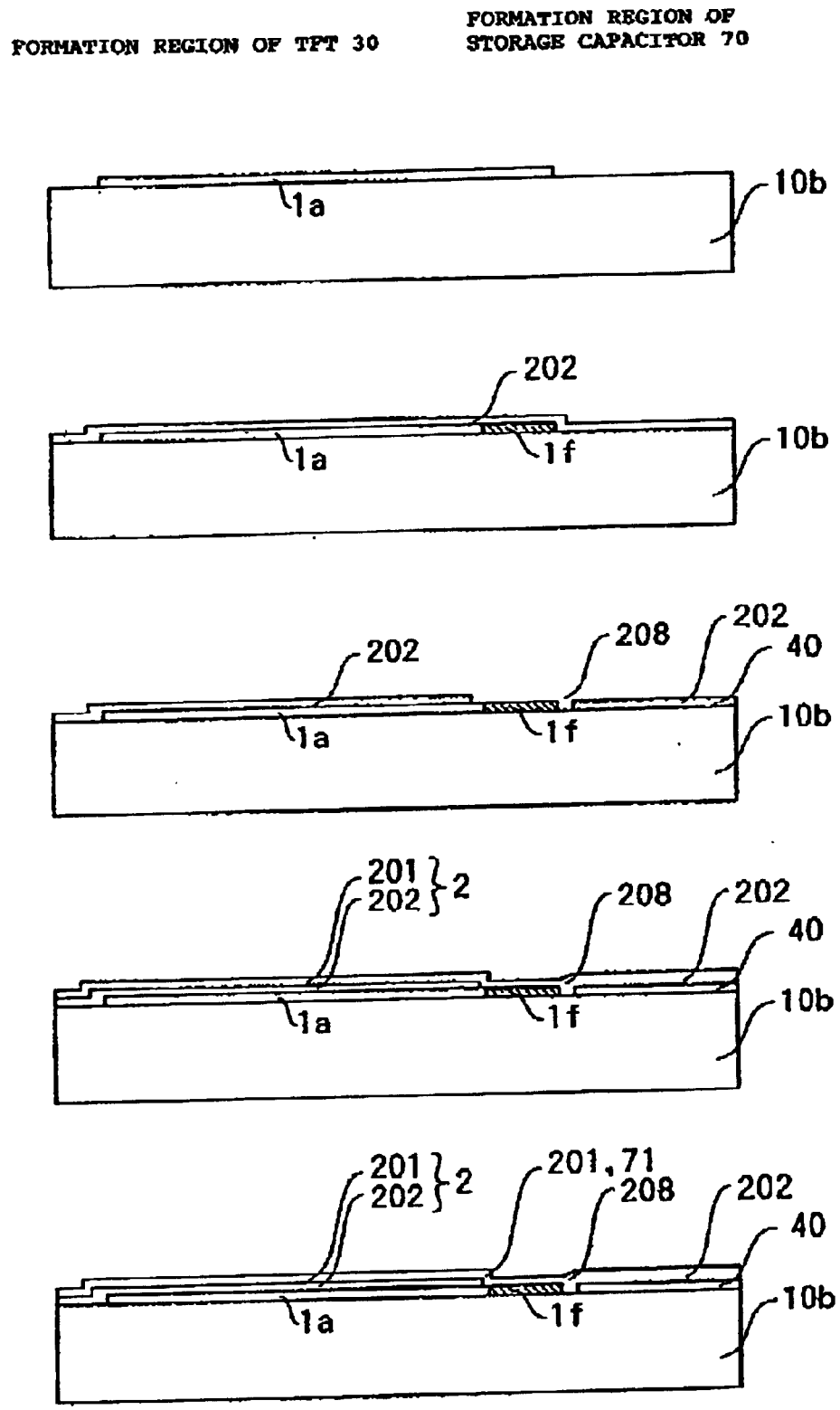
FIGS. 25(A) to 25(E) are sectional views respectively showing the steps of a method of manufacturing the active matrix substrate shown in FIG. 24.
Figure 26:
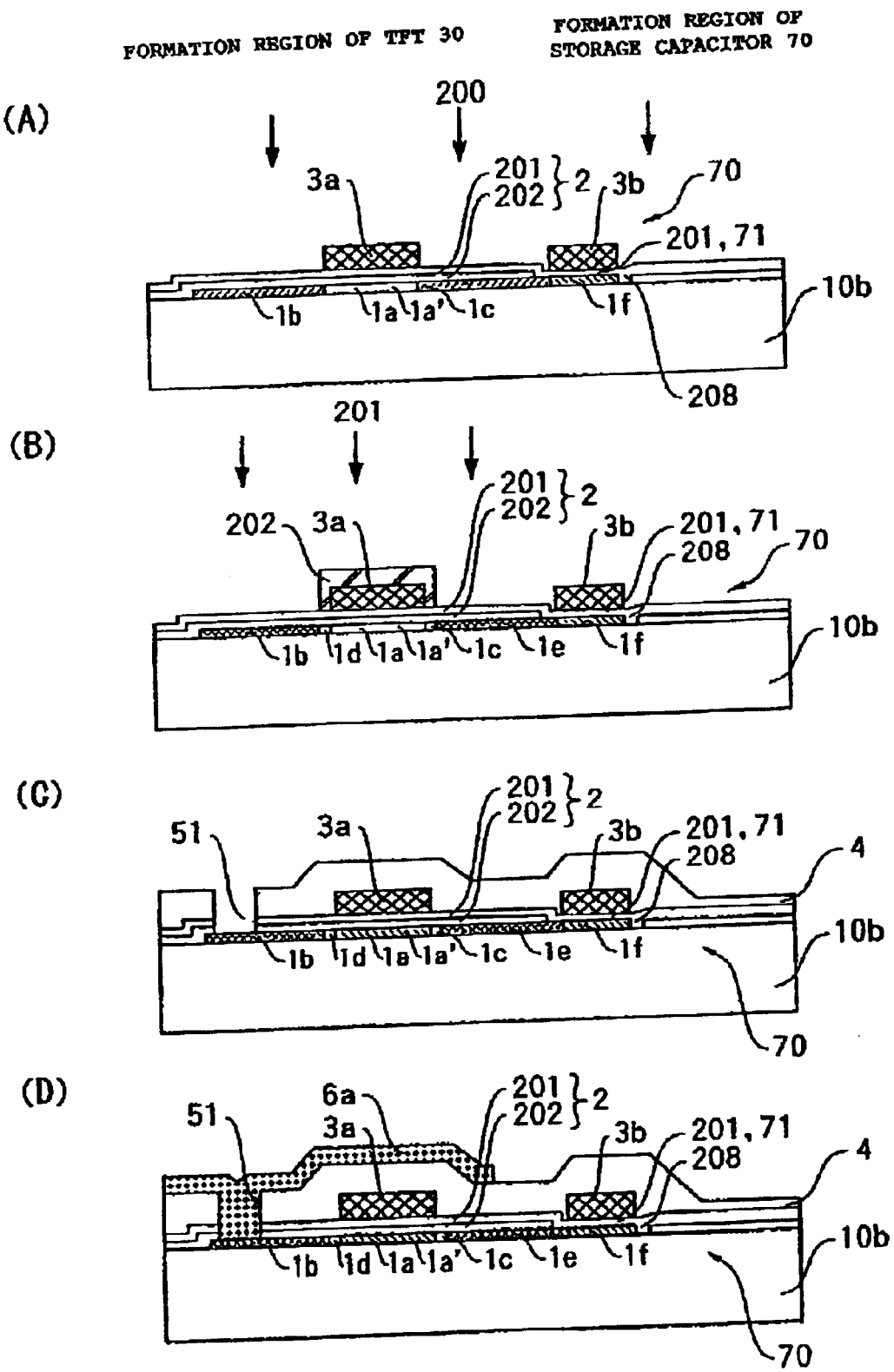
FIGS. 26(A) to 26(D) are sectional views respectively showing the steps after the steps shown in FIGS. 25(A)–25(E) in the method of manufacturing the active matrix substrate shown in FIG. 24.
Figure 27:
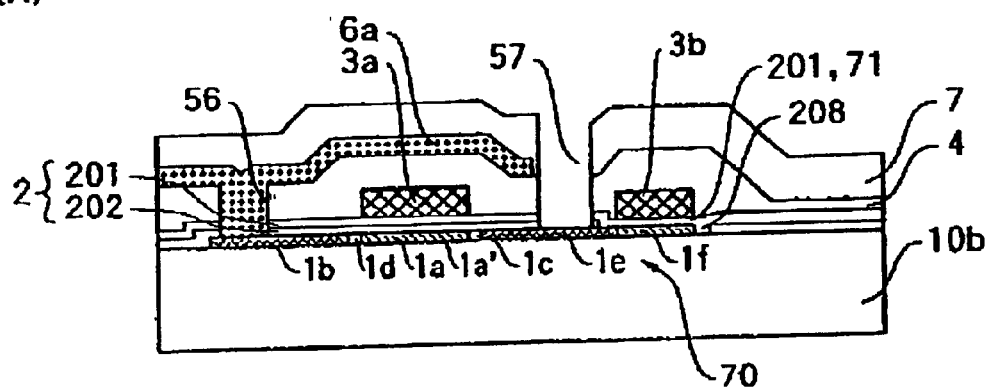
FIGS. 27(A) and 27(B) are sectional views respectively showing the steps after the steps shown in FIG. 26(A)–26(D) in the method of manufacturing the active matrix substrate shown in FIG. 24.
Figure 27:
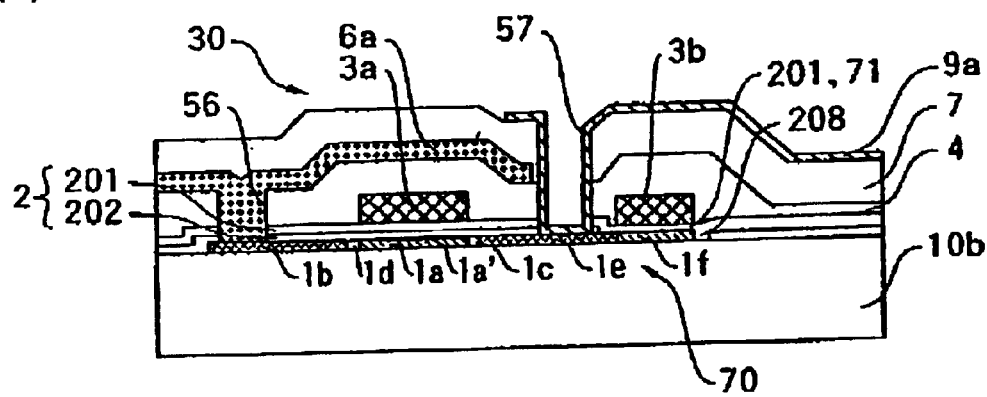

FIG. 24 is a sectional view of a liquid crystal device of the thirteenth embodiment of the present invention, taken along a plane corresponding to plane B–B' in FIG. 19. FIGS. 25(A) to 25(E), FIGS. 26(A) to 26(D) and FIGS. 27(A) and 27(B) are sectional views respectively showing the steps of the method of manufacturing the active matrix substrate shown in FIG. 24.

In the twelfth embodiment, each of the gate insulating layers 2 of the TFTs 30 and the insulating layers 71 of the storage capacitors 70 includes the tantalum oxide film 201 and the silicon oxide film 202. However, in this embodiment, as shown in FIG. 24, each of the gate insulating films 2 includes the tantalum oxide film 201 and the silicon oxide film 202, while each of the insulating layers 71 includes only the tantalum oxide film 201.

Namely, in this embodiment, like in the twelfth embodiment, each of the gate insulating films 2 includes the silicon oxide film 202 formed on the surface of the semiconductor film 1a by the CVD method or the like, and the tantalum oxide film 201 formed by high-pressure annealing oxidization of the whole of the tantalum film formed on the silicon oxide film 202.

However, each of the storage capacitors 70 includes the tantalum oxide film 201 formed by high-pressure annealing oxidization of the entire tantalum film formed on the silicon oxide film 202, but in the region where each of the lower electrode 1f is formed, the silicon oxide film 202 is partially removed to form an aperture 208. Therefore, only the tantalum oxide film 201 serving as the insulating layer 71 is present between the lower electrode 1f and the capacity line 3b (upper electrode). Therefore, in this embodiment, the insulating layers 71 have a high dielectric constant, and thus the storage capacitors 70 having a large capacity can be formed. In each of the intersections of the capacity lines 3b and the data lines 6b, the silicon oxide film 202 is preferably left even below the capacity line 3b in consideration of voltage resistance. Since the other configuration is the same as the twelfth embodiment, the portions having the same functions as the twelfth embodiment are denoted in FIG. 24 by the same reference numerals, and a description thereof is omitted.

In manufacturing the active matrix substrate 10 having the above construction, as shown in FIG. 25(A), an underlying protective film (not shown) is formed over the entire surface of the transparent substrate 10b as a base material of the active matrix substrate 10, and then an amorphous silicon film is formed on the underlying protective film. Then, the amorphous silicon film is annealed at about 600° C. for 1 hour to 10 hours in a nitrogen atmosphere to form a polysilicon film by solid-phase growth, and the polysilicon film is patterned by the photolithography technique to form island-like silicon films 1a.

Next, as shown in FIG.25(B), the silicon oxide film 202 is formed over the entire surface of the transparent substrate 10b by the CVD method. Then, a portion of the silicon film 1a, which corresponds to the lower electrode 1f of each of the storage capacitors 70, is doped with, for example, P ions in a dose of about $3 \times 10^{12}/cm^2$ to decrease electric resistance.

Next, as shown in FIG. 25(C), a portion of the silicon oxide film 202, which is positioned on the lower electrode 1f, is removed by the photolithography technique to form an aperture 208.

Next, as shown in FIG. 25(D), a tantalum film 205 (insulating layer-forming metal film) is formed over the entire surface of the transparent substrate 10b by the sputtering method or the like to cover the silicon oxide film 202.

Next, the aluminum film 205 is entirely annealed under high pressure in an atmosphere containing water vapor. The conditions of high-pressure annealing include a temperature of 600° C. or less, for example, 300° C. to 400° C., and a pressure of 0.5 MPa to 2 MPa. As a result, as shown in FIG. 25(E), the tantalum film 205 is entirely oxidized to form the tantalum oxide film 201. Therefore, the gate insulating layer 2 including the silicon oxide film 202 and the tantalum oxide film 201 is formed, and the insulating layer 71 comprising only the tantalum oxide film 201 is formed.

After high-pressure annealing, annealing is further performed at a temperature 200° C. to 500° C. under atmospheric pressure or low pressure to remove or substantially remove moisture from the tantalum oxide film 201, thereby enhancing crystallinity, and thus enhancing the quality of the tantalum oxide film 201.

Thereafter, like in the twelfth embodiment, an aluminum film is formed over the entire surface of the transparent substrate 10b by the sputtering method or the like to cover the gate insulating layer 2, and then patterned by the photolithography technique to form the scanning lines 3a, and the capacity lines 3b, as shown in FIG. 26(A). Next, the aluminum film is doped with a N-type impurity using the corresponding scanning lines 3a as a diffusion mask, and then, as shown in FIG. 26(B), the aluminum film is similarly doped with a N-type impurity using a resist mask 202 formed on the scanning lines 3a to be wider than the scanning lines 3a. Next, as shown in FIG. 26(C), an interlayer insulating film 4 including a silicon oxide film is formed to cover the scanning lines 3a and the capacity lines 3b, and then contact holes 56 are formed in the interlayer insulating film 4. Next, an aluminum film is formed over the entire surface of the transparent substrate 10b to cover the interlayer insulating film 4, and then patterned by the photolithography technique to form the data lines 6a, as shown in FIG. 26(D). Next, as shown in FIG. 27(A), an interlayer insulating film 7 including a silicon oxide film is formed to cover the data lines 6a, and then contact holes 57 are formed in the interlayer insulating films 7 and 4, and the gate insulating layer 2. Next, an ITO film is formed over the entire surface of the transparent substrate 10b by the sputtering method or the like to cover the interlayer insulating film 7, and then patterned by the photolithography technique to form the pixel electrodes 9a, as shown in FIG. 27(B). Then, as shown in FIG. 24, a coating solution of a polyimide alignment film is coated on the pixel electrodes 9a, and then rubbed in a predetermined direction with a predetermined pre-tilt angle to form the alignment film 64, completing the active matrix substrate 10.

[Other Embodiments]

Although, in the above-described embodiments, tantalum (Ta) is used for the insulating layer-forming metal film, a tantalum alloy may be used. Also, other metals such as niobium (Nb), molybdenum (Mo), titanium (Ti), or alloys thereof may be used as long as an oxide film can be formed by high-pressure annealing.

Although, in the above-described embodiments, a silicon oxide film is used as an insulating film to be laminated with a tantalum oxide film, a silicon nitride film may be used.

Furthermore, by using a semiconductor substrate as a substrate, not only a thin film transistor but also a bulk-type MIS transistor can be formed as a MIS semiconductor element. Namely, an insulating film including the same semiconductor material as the semiconductor substrate used as a substrate is formed on the upper surface of the semiconductor substrate, an insulating layer-forming metal film is formed and then annealed under high pressure, and then a metal layer is formed on an oxide film of the insulating layer-forming metal film to form the bulk-type MIS transistor.

Furthermore, in the above embodiments, an active matrix-system liquid crystal device using a TFT element as a pixel switching nonlinear element is described as an example, but the present invention is not limited to these embodiments. The present invention can be applied to cases in which capacitors are formed to constitute various circuits in other semiconductor devices, and various modifications can be made within the scope of the claims of the present invention. Of course, the scope of the present invention includes an active matrix-system liquid crystal device using a TFD element as a switching nonlinear element. Furthermore, the present invention can be applied to an electroluminescence (EL) device, a digital micro-mirror device (DMD), and electro-optic devices using various electro-optic elements using fluorescent light due to plasma emission or electron emission.

[Construction of Liquid Crystal Device]

Figure 28:
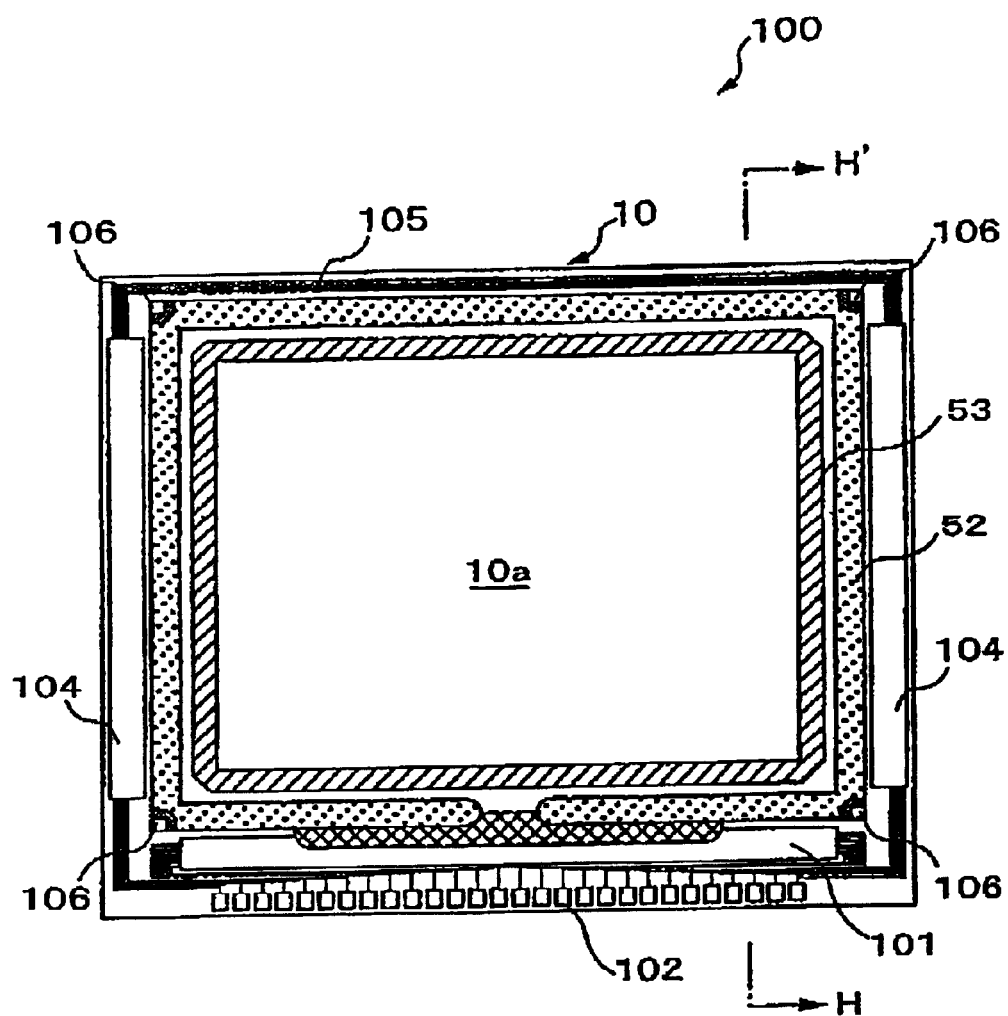
FIG. 28 is a plan view of a liquid crystal device as viewed from the counter substrate side.

The whole construction of the liquid crystal device 100 using the active matrix substrate 10 manufactured in each of the eighth to thirteenth embodiments is described with reference to FIGS. 28 and 29. FIG. 28 is a plan view of the liquid crystal device 100 together with the components formed thereon, as viewed from the counter substrate 20 side, and FIG. 29 is a sectional view of the liquid crystal device 100 including the counter. substrate 20, taken along plane H–H' in FIG. 28.

In FIG. 28, a sealing material 52 is provided on the active matrix substrate 10 of the liquid crystal device 100 along the edge thereof, and a frame 53 including a light shielding material is formed inside the sealing material 52. Also, in the region outside the sealing material 52, a data line driving circuit 101 and mounting terminals 102 are provided along one side of the active matrix substrate 10, and scanning line driving circuits 104 are formed along the two sides adjacent to the one side. If delay of a scanning signal supplied to the scanning lines is not a problem, of course, the scanning line driving circuit 104 may be provided along only one side. Also, the data line driving circuits 101 may be provided along both sides of the image display region 10a. For example, image signals may be supplied to odd-numbered data lines from the data line driving circuit provided along one side of the image display region 10a; image signals may be supplied to even-numbered data lines from the data line driving circuit provided along the opposite side of the image display region 10a. In this way, when the data lines are driven in a comb-like manner, the formation area of the data line driving circuits 101 can be extended to permit formation of a complicated circuit. Furthermore, a plurality of wirings 105 is provided on the remaining side of the active matrix substrate 10, to connect the scanning line driving circuits 104 provided on both sides of the image display region 10a. In some cases, a pre-charge circuit and an inspecting circuit are provided by using a portion below the frame 53. Also, a vertical conducting material 106 is formed at at least one corner of the counter substrate 20, to achieve electrical conduction between the active matrix substrate 10 and the counter substrate 20.

Figure 29:
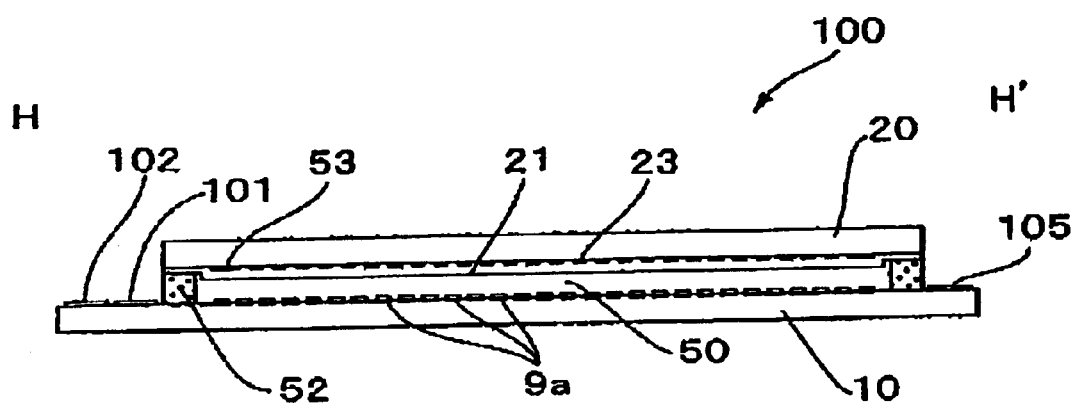
FIG. 29 is a sectional view taken along plane H–H' in FIG. 28.

As shown in FIG. 29, the counter substrate 20 having substantially the same outline as the sealing material 52 shown in FIG. 28 is fixed to the active matrix substrate 10 with the sealing material 25. In the counter substrate 20, a light shielding film 23 referred to as a "black matrix" or "black stripes" is formed in regions opposing the longitudinal and lateral boundary regions of the pixel electrodes 9a which are formed on the active matrix substrate 10. Also, a counter electrode 21 including an ITO film is formed on the light shielding film 23. Furthermore, an alignment film comprising polyimide (not shown) is formed on the counter electrode 21, the alignment film comprising a rubbed polyimide film.

Instead of forming the data line driving circuit 101 and the scanning line driving circuit 104 on the active matrix substrate 10, for example, a TAB (tape automated bonding) substrate on which driving LSI is mounted may be electrically and mechanically connected to the terminal group formed in the periphery of the active matrix substrate 10 through an anisotropic conductive film. Furthermore, a polarization film, a retardation film and a polarization plate are disposed on the light incidence side or light emission side of the counter substrate 20 and the active matrix substrate 10 according to the type of the liquid crystal 50 used, i.e., operation modes such as TN (twisted nematic) mode, STN (super TN) mode, and the like, a normally black mode, normally white mode, and the like.

An electro-optic device formed as described above is used in, for example, a projection liquid crystal device (liquid crystal projector) described below. In this case, three liquid crystal devices 100 are used as light valves for RGB colors, and lights of the colors, which are separated through a RGB separation dichroic mirror, are respectively incident as projection light on the liquid crystal devices 100. Therefore, the liquid crystal device 100 of each of the embodiments does not include a color filter.

However, when a RGB color filter is formed on the counter substrate 20 opposite to each of the pixel electrodes 9a together with a protective film, the electro-optic device can be used as a color liquid crystal display device of an electronic apparatus, such as a mobile computer, a cellular phone, a liquid crystal television, etc. other than the projection liquid crystal display device.

Furthermore, by forming a micro lens on the counter substrate 20 corresponding to each of the pixels, the efficiency of incident light collection in the pixel electrodes 9a can be enhanced, thereby permitting a bright display. Furthermore, several interference layers having different refractive indexes may be laminated on the counter substrate 20 to form a dichroic filter for forming RGB colors by using light interference. By using the counter substrate with the dichroic filter, a brighter color display can be performed.

[Application to Electronic Apparatus]

Examples of electronic apparatuses each comprising an electro-optic device are described with reference to FIGS. 30, 31, 32 and 33.

Figure 30:
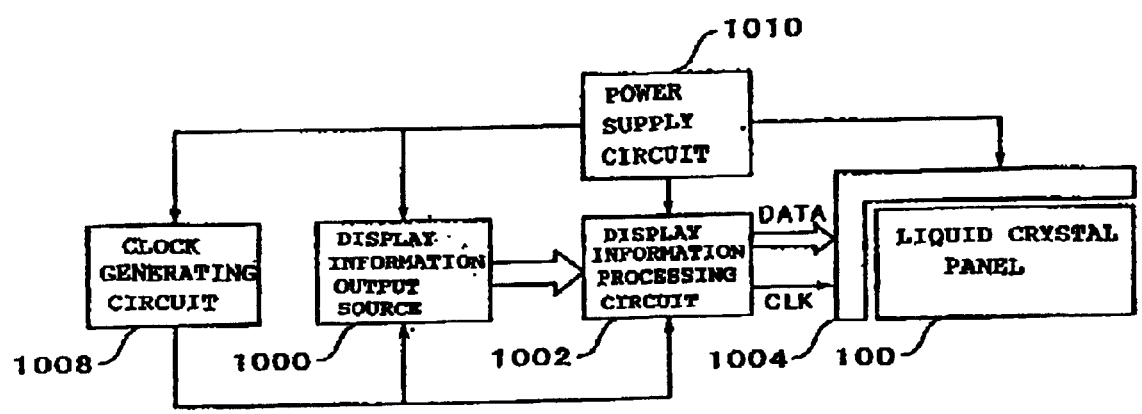
FIG. 30 is a schematic showing the circuit configuration of an electronic apparatus using a liquid crystal device of the present invention as a display section.

FIG. 30 is a schematic showing the configuration of an electronic apparatus comprising a liquid crystal device 100 having the same construction as the electro-optic device of each of the embodiments.

In FIG. 30, the electronic apparatus includes a display information output source 1000, a display information processing circuit 1002, a driving circuit 1004, the liquid crystal device 100, a clock generating circuit 1008, and a power supply circuit 1010. The display information output source 1000 includes a memory, such as ROM (Read Only Memory), RAM (Random Access Memory), an optic disk, or the like, a tuning circuit to tune and output an image signal of a television signal, etc. to process the image signal in a predetermined format and output the signal to the display information processing circuit 1002 based on the clock from the clock generating circuit 1008. The display information processing circuit 1002 includes various related art processing circuits, for example, an amplifying and inverting circuit, a phase expansion circuit, a rotation circuit, a gamma correction circuit, a clamp circuit and the like, so that a digital signal is successively produced from display information input based on a clock signal and is output to the driving circuit 1004 together with clock signal CLK. The driving circuit 1004 drives the liquid crystal device 100. The power supply circuit 1010 supplies predetermined electric power to each of the circuits. The driving circuit 1004 may be formed on the active matrix substrate 10 constituting the liquid crystal device 100, and the display information processing circuit 1002 may also be formed on the active matrix substrate 10.

Examples of an electronic apparatus having the above configuration include a projection liquid crystal display device (liquid crystal projector) described below with reference to FIG. 31, a personal computer for multimedia (PC), an engineering work station (EWS), a pager, a cellular phone, word processor, a television, a view finder-type or monitor direct-viewing video tape recorder, an electric notebook, an electric table calculator, a car navigation device, a POS terminal, a touch pane, etc., for example. Of course, the present invention can be applied to an electronic apparatus including an electro-optic device, such as an electroluminescence device (EL), a digital micro-mirror device (DMD), and various electro-optic elements using fluorescent light due to plasma emission or electron emission, etc., for example.

Figure 31:
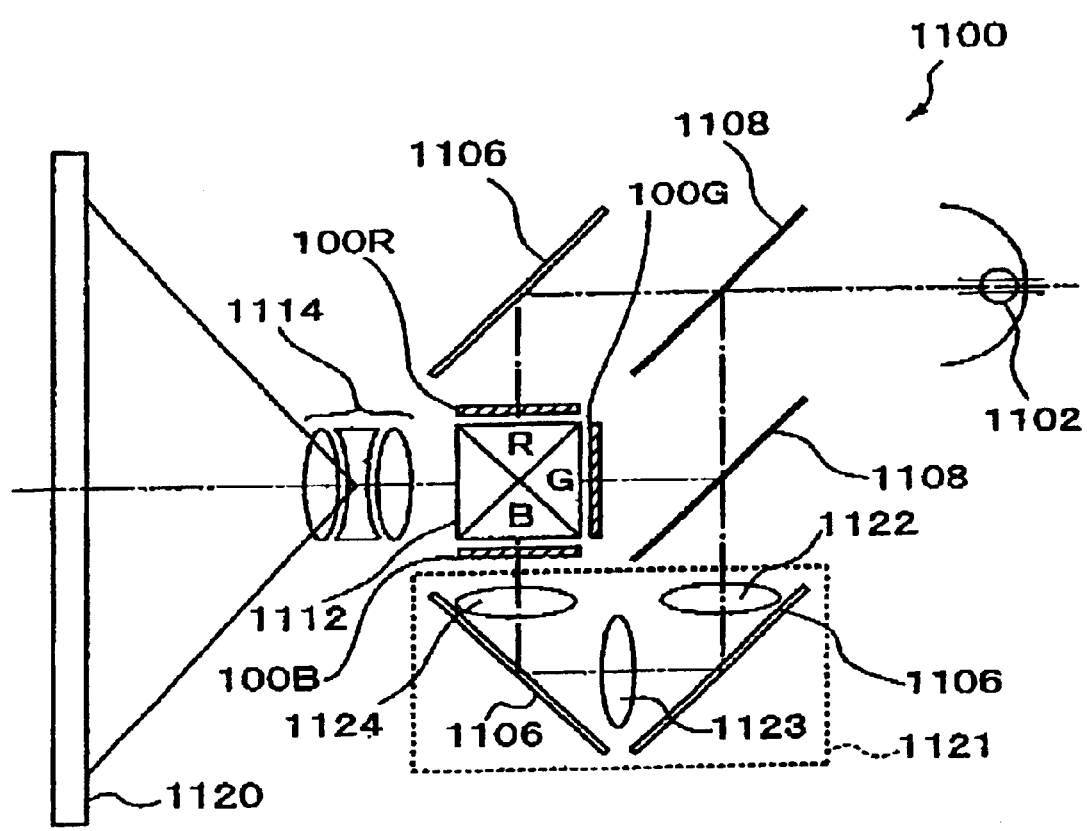
FIG. 31 is a sectional view showing the configuration of an optical system of a projection electro-optic device as an example of an electronic apparatus using a liquid crystal device of the present invention.

The projection liquid crystal device 1100 shown in FIG. 31 is used as a projector including three liquid crystal modules each including the driving circuit 104 mounted on a liquid crystal device 100, the liquid crystal modules being used as respective light valves 100R, 100G and 100R for RGB colors. In the liquid crystal projector 1100, when light is emitted from a lamp unit 1102 including a metal halide lamp as a white light source, the light is separated (a light separating device) into light components R, G and B corresponding to the primary colors R, G and B by three mirrors 1106 and two dichroic mirrors 1108, and the light components are guided to the light valves 100R, 100G and 100B (liquid crystal devices 100/liquid crystal light valves), respectively. In this case, the light component B has a long optical path, and is thus guided through a relay lens system 1121 including an incidence lens 1122, a relay lens 1123, and an emission lens 1124 in order to prevent or reduce a light loss. The light components R, G and B corresponding to the primary colors and modulated by the light valves 100R, 100G and 100B, respectively, are incident on a dichroic prism 1112 (photo-synthesis means) from three directions, again combined, and then projected as a color image on a screen 120 through a projection lens 1114.

Figure 32:
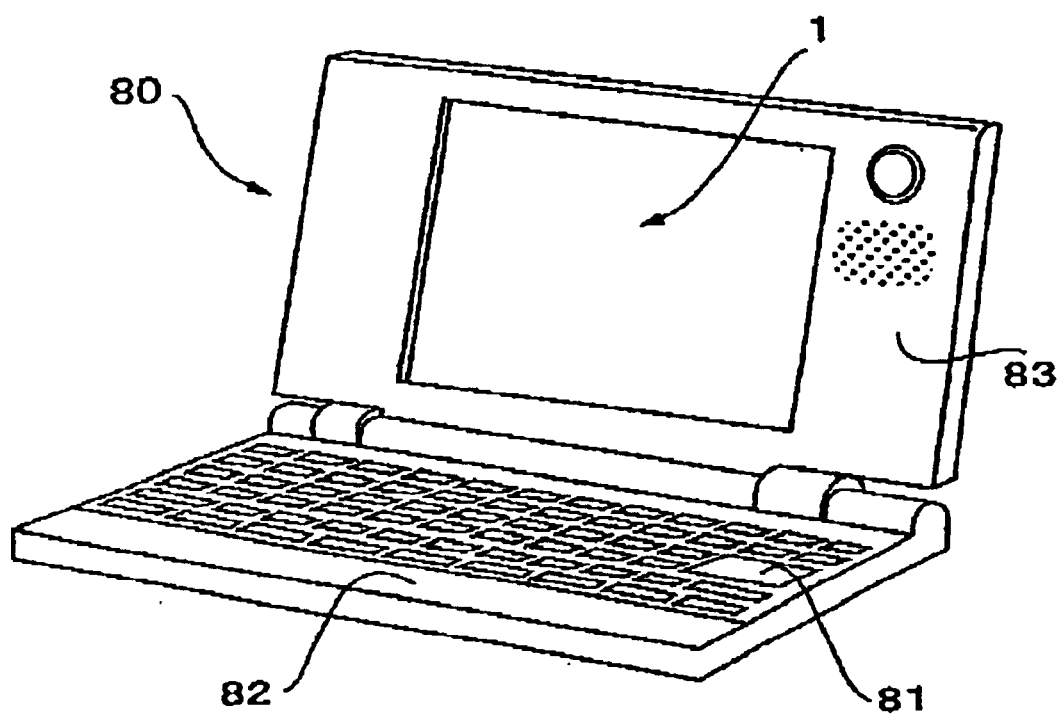
FIG. 32 is a perspective view illustrating a mobile personal computer as an example of an electronic apparatus using a liquid crystal device of the present invention.

FIG. 32 shows a mobile personal computer as an electronic apparatus according to an embodiment of the present invention. The personal computer shown in FIG. 32 includes a body section 82 including a keyboard 81, and a liquid crystal display unit 83. The liquid crystal display unit 83 includes the above-described liquid crystal device 100.

Figure 33:
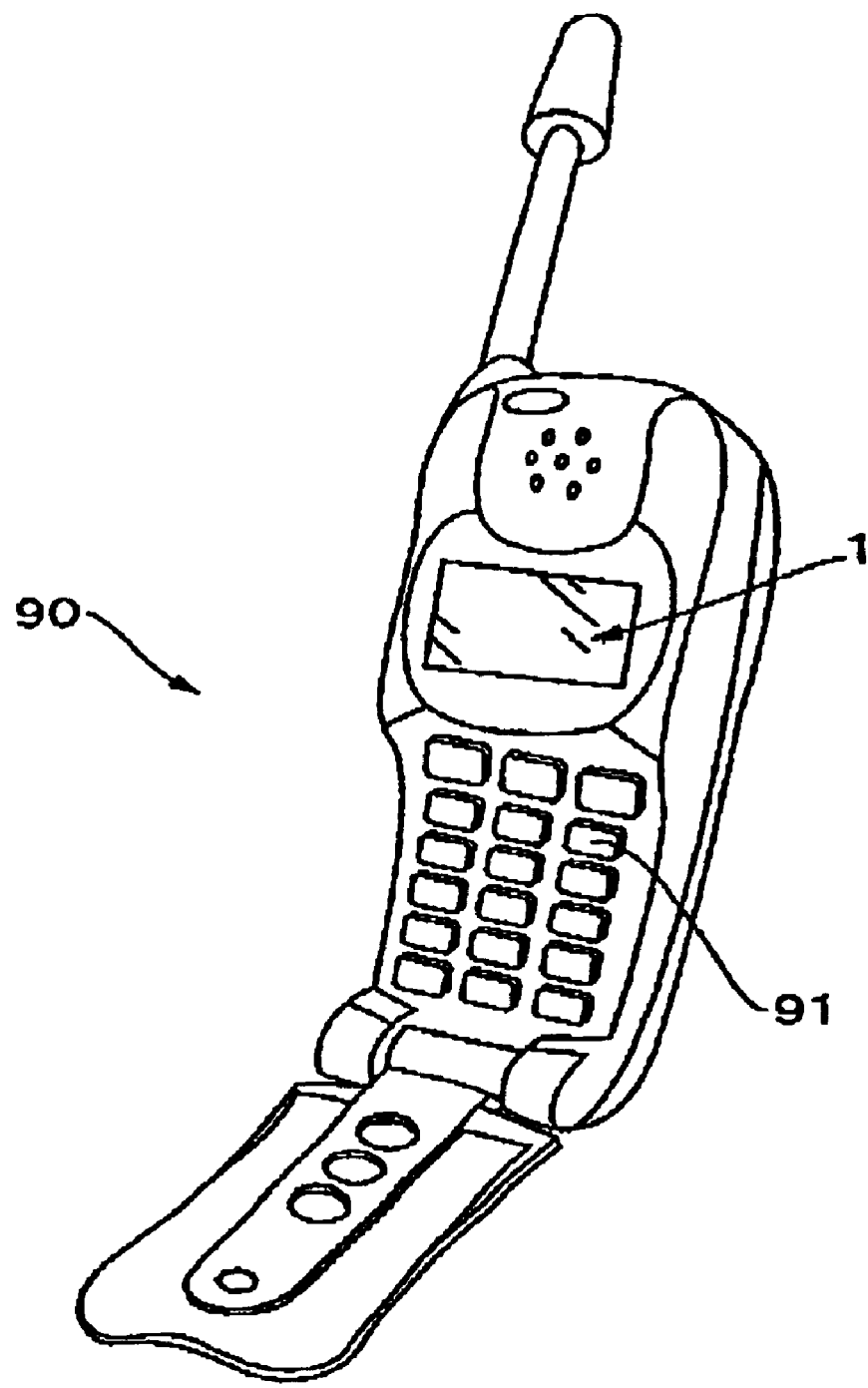
FIG. 33 is a perspective view illustrating a cellular phone as an example of an electronic apparatus using a liquid crystal device of the present invention.

FIG. 33 shows a cellular phone as an electronic apparatus according to another embodiment of the present invention. The cellular phone 90 shown in FIG. 33 includes a plurality of operating buttons 91, and a liquid crystal device 100.

As described above, in the present invention, an insulating layer of a capacitor includes a tantalum oxide film produced by high-pressure annealing, and thus has high voltage resistance. In the present invention, the tantalum oxide film is formed by high-pressure annealing, and thus feed wiring for anodization is not required. Therefore, a semiconductor device including TFT, etc. formed on the same substrate has a high degree of design freedom. There is also the advantage that many substrates can be simultaneously processed. Furthermore, the sufficient temperature for high-pressure annealing is 600° C. or less, particularly 300° C. to 400° C., and thus no problem occurs in use of a glass substrate as the substrate. Even when aluminum wiring is formed, high-pressure annealing under the temperature condition causes no deterioration in the aluminum wiring unless the aluminum wiring is exposed from the surface of the substrate. A semiconductor device according to the present invention includes an insulating layer including a tantalum oxide film produced by high-pressure annealing, and thus the insulating layer has high voltage resistance. Furthermore, the temperature of high-pressure annealing is 300° C. to 400° C., and thus no problem occurs in use of a glass substrate as the substrate. Even when aluminum wiring is formed, high-pressure annealing under the temperature condition causes no deterioration in the aluminum wiring unless the aluminum wiring is exposed from the surface of the substrate.

What is claimed is:

1. A capacitor, comprising:
    a lower electrode;
    an insulating layer, the insulating layer including an oxide film formed by high-pressure annealing oxidation of an insulating layer-forming metal film under a high pressure in an atmosphere containing water vapor; and
    an upper electrode, the lower electrode, the insulating layer and the upper electrode being laminated in that order.

2. The capacitor according to claim 1, the insulating layer including only the oxide film.

3. The capacitor according to claim 1, the insulating layer having a multilayer structure including the oxide film and another insulating film.

4. The capacitor according to claim 1, the insulating layer-forming metal film including at least one of a tantalum film and a tantalum alloy film.

5. The capacitor according to claim 1, at least the insulating layer side of the lower electrode including the same metal as the insulating layer-forming metal film.

6. The capacitor according to claim 1, the lower electrode including a different material from the insulating layer-forming metal film.

7. A semiconductor device, comprising:
    the capacitor according to claim 1.

8. An electro-optic device, comprising:
    the semiconductor device according to claim 7 usable as an active matrix substrate, the capacitor of the semiconductor device being usable as a storage capacitor of each pixel of the active matrix substrate.

9. A method of manufacturing a capacitor that includes a lower electrode, an insulating layer and an upper electrode, the method comprising:
    forming an insulating layer-forming metal film; and
    oxidizing the insulating layer-forming metal film by high-pressure annealing under a high pressure in an atmosphere containing water vapor to form an oxide film used as one of the insulating layer and a part of the insulating layer.

10. The method of manufacturing a capacitor according to claim 9, the insulating layer-forming metal film including at least one of a tantalum film and a tantalum alloy film.

11. The method of manufacturing a capacitor according to claim 9, only the surface of the insulating layer-forming metal film being oxidized by the high-pressure annealing to form the oxide film used as the insulating layer or a part of the insulating layer, the remainder of the insulating layer-forming metal film being used as the lower electrode or a part of the lower electrode.

12. The method of manufacturing a capacitor according to claim 9, further comprising forming the lower electrode below the insulating layer-forming metal film, and entirely oxidizing the insulating layer-forming metal film by the high-pressure annealing to form the oxide film used as the insulating layer or a part of the insulating layer.

13. The method of manufacturing a capacitor according to claim 9, the high-pressure annealing being performed at a temperature of 600° C. or less.

14. The method of manufacturing a capacitor according to claim 9, the high-pressure annealing being performed at a temperature of 300 to 400° C. under a pressure of 0.5 MPa to 2 MPa.

15. The method of manufacturing a capacitor according to claim 9, further comprising performing annealing under the atmospheric pressure or a low pressure after the high-pressure annealing.

16. A method of manufacturing a semiconductor device, comprising:
    manufacturing a capacitor on a substrate by a manufacturing method according to claim 9.

17. A semiconductor device, comprising:
    a substrate;
    a MIS semiconductor element formed on the substrate and including a MIS section including a metal layer, an insulating layer and a semiconductor layer, the insulating layer including an oxide film formed by high-pressure annealing oxidization of an insulating layer-forming metal film under a high pressure in an atmosphere including water vapor.

18. The semiconductor device according to claim 17, the insulating layer-forming metal film including at least one of a tantalum (Ta) film and a tantalum alloy film.

19. The semiconductor device according to claim 17, the metal layer side of the insulating layer including an oxide film formed from the insulating layer-forming metal film, and the semiconductor layer side including an insulating film formed from the same semiconductor material as the semiconductor layer.

20. The semiconductor device according to claim 17, at least the insulating layer side of the metal layer including the same metal material as the insulating layer-forming metal film.

21. The semiconductor device according to claim 17, the metal layer including a different metal material from the insulating layer-forming metal film.

22. The semiconductor device according to claim 17, the metal layer, the insulating layer and the semiconductor layer being formed on the substrate in that order from the lower layer side to the upper layer side.

23. The semiconductor device according to claim 17, the semiconductor layer, the insulating layer and the metal layer being formed on the substrate in that order from the lower layer side to the upper layer side.

24. The semiconductor device according to claim 17, the MIS semiconductor element being a thin film transistor.

25. The semiconductor device according to claim 23, the MIS semiconductor element being a MIS transistor.

26. The semiconductor device according to claim 17, the MIS semiconductor element being a MIS diode.

27. The semiconductor device according to claim 17, further comprising a capacitor formed on the substrate and including at least an oxide film formed, as a dielectric film, from the same layer as an oxide film of the insulating layer-forming metal film, and the metal layer as an electrode.

28. An electro-optic device, comprising:
the semiconductor device according to claim 24 usable as an active matrix substrate, the thin film transistor being usable as a pixel switching nonlinear element on the substrate.

29. The electro-optic device according to claim 28, further comprising a storage capacitor formed on the active matrix substrate, and including at least an oxide film formed, as a dielectric film, from the same layer as an oxide film of the insulating layer-forming metal film, and the metal layer as an electrode.

30. A method of manufacturing a semiconductor device that includes a MIS semiconductor element which is formed on a substrate, and which includes a MIS section including a metal layer, an insulating layer and a semiconductor layer, the method comprising:
forming an insulating layer-forming metal film; and
oxidizing the insulating layer-forming metal film by high-pressure annealing under a high pressure in an atmosphere containing water vapor to form an oxide film used as a part of the insulating layer.

31. The method of manufacturing a semiconductor device according to claim 30, the insulating layer-forming metal film including at least one of a tantalum film and a tantalum alloy film.

32. The method of manufacturing a semiconductor device according to claim 30, only the surface of the insulating layer-forming metal film being oxidized by the high-pressure annealing to form the oxide film used as a part of the insulating layer, the remainder of the insulating layer-forming metal film being used as the metal layer or a part of the metal layer.

33. The method of manufacturing a semiconductor device according to claim 30, the insulating layer-forming metal film being entirely oxidized by the high-pressure annealing to form the oxide film used as a part of the insulating layer.

34. The method of manufacturing a semiconductor device according to claim 33, further comprising forming the metal layer below the insulating layer-forming metal film, annealing the insulating layer-forming metal film under a high pressure, and forming an insulating film including the same semiconductor material as the semiconductor layer and the semiconductor layer in that order on an oxide film of the insulating layer-forming metal film.

35. The method of manufacturing a semiconductor device according to claim 33, further comprising forming the semiconductor layer and an insulating layer including the same semiconductor material as the semiconductor layer below the insulating layer-forming metal film, annealing the insulating layer-forming metal film under a high pressure, and forming the metal layer on an oxide film of the insulating layer-forming metal film.

36. The method of manufacturing a semiconductor device according to claim 35, further comprising forming an insulating film including the same semiconductor material as the semiconductor layer on a semiconductor substrate used as the substrate, forming the insulating layer-forming metal film, annealing the insulating layer-forming metal film under a high pressure, and forming the metal layer on an oxide film of the insulating layer-forming metal film.

37. The method of manufacturing a semiconductor device according to claim 30, a thin film transistor being produced as the MIS semiconductor element including the MIS section.

38. The method of manufacturing a semiconductor device according to claim 36, a MIS transistor being produced as the MIS semiconductor element including the MIS section.

39. The method of manufacturing a semiconductor device according to claim 30, a MIS diode being produced as the MIS semiconductor element including the MIS section.

40. The method of manufacturing a semiconductor device according to claim 30, further comprising forming a capacitor on the substrate, the capacitor including at least an oxide film which is formed at the same time as an oxide film of the insulating layer-forming metal film and which is used as an insulating layer or a part of the insulating layer, and a metal layer formed at the same time as the metal layer and used as an electrode.

41. The method of manufacturing a semiconductor device according to claim 30, the high-pressure annealing being performed at a temperature of 300 to 400° C. under a pressure of 0.5 MPa to 2 MPa.

42. The method of manufacturing a semiconductor device according to claim 30, further comprising performing annealing under the atmospheric pressure or a low pressure after the high-pressure annealing.

43. An electronic apparatus, comprising:
the electro-optic device according to claim 8.

* * * * *